United States Patent
Yamauchi

(10) Patent No.: US 6,728,148 B2
(45) Date of Patent: Apr. 27, 2004

(54) PROGRAMMED VALUE DETERMINING CIRCUIT, SEMICONDUCTOR INTEGRATED CIRCUIT DEVICE INCLUDING THE SAME, AND METHOD FOR DETERMINING PROGRAMMED VALUE

(75) Inventor: Hiroyuki Yamauchi, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/232,785

(22) Filed: Aug. 28, 2002

(65) Prior Publication Data

US 2003/0043652 A1 Mar. 6, 2003

(30) Foreign Application Priority Data

Aug. 29, 2001 (JP) ........................ 2001-259795

(51) Int. Cl.[7] ................................ G11C 7/00
(52) U.S. Cl. ................... 365/200; 365/225.7
(58) Field of Search ............... 365/200, 225.7

(56) References Cited

U.S. PATENT DOCUMENTS

| | | | | |
|---|---|---|---|---|
| 5,619,469 A | * | 4/1997 | Joo | ................ 365/225.7 |
| 6,400,618 B1 | * | 6/2002 | Nakamura et al. | .......... 365/200 |
| 6,430,101 B1 | * | 8/2002 | Toda | ................ 365/225.7 |
| 6,433,405 B1 | * | 8/2002 | Gunderson et al. | ...... 365/225.7 |
| 6,480,428 B2 | * | 11/2002 | Zheng et al. | ............ 365/225.7 |
| 6,480,430 B2 | * | 11/2002 | Sato | ................ 365/222.7 |
| 6,489,810 B2 | * | 12/2002 | Ferrant | ................ 365/225.7 |
| 6,525,982 B1 | * | 2/2003 | Cowles | ................ 365/225.7 |

FOREIGN PATENT DOCUMENTS

JP            10-334693            12/1998

* cited by examiner

Primary Examiner—Trong Phan
(74) Attorney, Agent, or Firm—Merchant & Gould P.C.

(57) ABSTRACT

A programmed value determining circuit is provided in which both the area of the programmable element and the leak current are reduced. During the first period after power is turned on, both the PMOS transistor Qp1 and the NMOS transistor Qn1 are turned off, and the storage node is disconnected from the power line VDD and the ground line VSS. During the second period after the first period, at least the NMOS transistor Qn1 is turned on, the storage node is connected to the ground line VSS via the program element 10, and the state of the storage node is detected by the detecting portion 11. During the third period after the second period, the PMOS transistor Qp1 and the NMOS transistor Qn1 are turned off, and the state of the storage node is held by the latch portion 12.

22 Claims, 13 Drawing Sheets

PROGRAMMED VALUE DETERMINING CIRCUIT, SEMICONDUCTOR INTEGRATED CIRCUIT DEVICE INCLUDING THE SAME, AND METHOD FOR DETERMINING PROGRAMMED VALUE

BACKGROUND OF THE INVENTION

1. Field of the Invention

The present invention relates to a semiconductor integrated circuit device including a programmable element, and a technique for achieving both a reduction of leak current and a decrease of the area of the programmable element. In particular, the present invention relates to a technique for achieving both a decrease of the area of a fuse element or the like and a reduction of leak current flowing through a residual resistance thereof in a memory block on which a plurality of programmable elements have to be mounted for redundancy repair.

2. Description of the Related Art

Conventionally, in general, a fuse element is utilized as a programmable element, for example, used in a memory block, and the presence or the absence of a program generally is set by either irradiating the fuse element with laser to melt and cut (blow) the fuse element or not doing so. However, in order to blow the fuse element with high precision, it is necessary to adjust the power of the laser for irradiation.

FIGS. 12A, 12B and 12C are circuit diagrams showing an example of the configuration of a conventional programmed value determining circuit employing a fuse element as a programmable element used in a memory block and the like. FIG. 12A shows a state in which there is no program before a fuse element 100 is blown. FIG. 12B shows a state in which there is a program after the fuse element 100 has been blown with a high laser power. FIG. 12C shows a state in which there is a program after the fuse element 100 has been blown with a low laser power.

In FIG. 12A, when a voltage with a logic "H" level is applied to an input node N1, a PMOS transistor Qp1 in the first stage is turned off, and an NMOS transistor Qn1 in the first stage is turned on. Since the fuse element 100 is connected, an intermediate node (storage node) N2 is in a logic "L" level, which is the electric potential of the ground line VSS, and a PMOS transistor Qp3 in the second stage is turned on and an NMOS transistor Qn2 in the second stage is turned off, so that a voltage with a logic "H" level, which is the electric potential of the power line VDD, is output to an output node N3. Thus, a PMOS transistor Qp2 is turned off. This is the state in which there is no program.

On the other hand, in FIGS. 12B and 12C in which the fuse element 100 is blown, when a voltage with a logic "H" level is applied to an input node N1, a PMOS transistor Qp1 in the first stage is turned off, and an NMOS transistor Qn1 is turned on. However, since the fuse element 100 is cut off, the intermediate node N2 becomes in a logic "H" level, which is the electric potential of the power line VDD, by turning the PMOS transistor Qp2 on, and the PMOS transistor Qp3 in the second stage is turned off and an NMOS transistor Qn2 in the second stage is turned on, so that a voltage with a logic "L" level, which is the electric potential of the ground line VSS is output to an output node N3. This is the state in which there is a program.

As shown in FIG. 12B, in order to blow the fuse element 100 completely (the residual resistance of the fuse element 100 is, for example, 1 M ohm or more), it is sufficient to increase the power of the laser for irradiation, but the fuse elements in the vicinity thereof may be melted and cut. Therefore, when providing a plurality of fuse elements, the area may increase because the distance between the adjacent fuse elements is increased or transistors cannot be laid out in the adjacent regions.

On the other hand, when the power of the laser for irradiation is low, an irradiation point also is small, so that the influence on the adjacent region can be small. However, the residual resistance of the fuse element 100 becomes low (e.g., 10 k ohm or less), so that a leak current Ileak flows from the power line VDD to the ground line VSS through the PMOS transistor Qp2 and the NMOS transistor Qn1, as shown in FIG. 12C.

FIG. 13 is a graph showing the relationship of the residual resistance Rfuse and the leak current Ileak caused to flow thereby after the fuse element 100 has been blown, with respect to the fuse pitch Hpitch and the relative laser power Lpower.

As shown in FIG. 13, when the fuse pitch Hpitch is small and the relative laser power Lpower is small, the fuse element 100 is melted and cut completely in some cases, and in other cases, it is not completely melted and cut, which creates instability, so that the residual resistance Rfuse are varied significantly. In particular, when the residual resistance Rfuse becomes small, the leak current Ileak becomes large. Therefore, conventionally, there is a trade-off between the fuse pitch Hpitch, that is, the area and the leak current Ileak.

In the future, process miniaturization will be promoted, and a large number of functions will be integrated. With this trend, it becomes more important to constitute a circuit that implements a defect recovery function with FPGA (Field Programmable Gate Array) or the like, so that it is expected that a demand for program elements that are mounted on an LSI will be increased rapidly. In this case, the area of the programmable elements will be an issue.

In addition to blowing the fuse element as described above, in order to form a programmable element, a polysilicon line can be melted and cut by applying a high voltage, or a high voltage stress is applied to increase the threshold voltage, as is the case with a flash memory. However, in all of these methods, the programmable element has to be spaced apart from adjacent devices or the area thereof has to be increased in order to change the resistance or the threshold voltage stably.

When reducing the area to increase the degree of integration, the change in the resistance of the polysilicon line or the change in the threshold voltage of the flash memory may become insufficient, and the problem of leak current is likely to be induced.

SUMMARY OF THE INVENTION

Therefore, with the foregoing in mind, it is an object of the present invention to provide a programmed value determining circuit in which there is no relationship of a trade-off between the area of the programmable element and the leak current, and both the area of the programmable element and the leak current are reduced, and provide a semiconductor integrated circuit device having the programmed value determining circuit and a method for determining a programmed value.

A programmed value determining circuit of the present invention includes a programmable element whose resistance is changed depending on whether or not there is a program, a detecting portion including a first circuit and a second circuit, and latch means. The first circuit includes first and second switching elements that operate in response to first and second control signals respectively, and are connected to the program element in series between a first power terminal and a second power terminal. At least the first switching element is inserted between the first power terminal and an intermediate connection node. At least the second switching element connected to the programmable element in series is inserted between the intermediate connection node and the second power terminal. The second circuit converts an electric potential at the intermediate connection node to a logic level and outputting it to an output node. The latch means latches the electric potential at the intermediate connection node to make the intermediate connection node act as a storage node of a programmed value of the programmable element. During a second period subsequent to the first period after power is turned on, at least the second switching element is turned on, the storage node is connected to the second power terminal via the programmable element, and the state of the storage node is detected by the detecting portion. During a third period after the second period, both the first and the second switching elements are turned off, and the state of the storage node is held by the latch means.

In the programmed value determining circuit of the present invention, during the first and the third periods, the opposite terminals of the programmable element are disconnected from at least one of the first and the second power terminals. During the second period, each of the opposite terminals of the programmable element is connected to the first or the second power terminal directly or via the first or the second switching element.

In the programmed value determining circuit of the present invention, the first switching element is constituted by a first transistor controlled in response to the first control signal. The second switching element is constituted by a second transistor controlled in response to the second control signal. The storage node is connected to the first power terminal via the first transistor and is connected to one terminal of the programmable element via the second transistor, and the other terminal of the programmable element is connected to the second power terminal. The first transistor is turned off during the first period, turned on during the second period, and turned off during the third period in response to the first control signal. The second transistor is turned off during the first period, turned on during the second period, and turned off during the third period in response to the second control signal.

This configuration makes the following control possible. The second period during which the state of the program of the programmable element is detected is restricted to a predetermined period during power-on, and only during this period, the storage node of the programmed value is connected to one power terminal via the programmable element. However, during the other periods, such as the first and the third periods, the storage node is disconnected therefrom, and the programmable element is disconnected completely from leak paths between the power terminals. Thus, the relationship of a trade-off between the area of the programmable element and the leak current can be eliminated, and both the area of the programmable element and the leak current can be reduced.

In the programmed value determining circuit of the present invention, the first switching element is constituted by a first transistor controlled in response to the first control signal, and the second switching element is constituted by a second transistor controlled in response to the second control signal. The storage node is connected to the first power terminal via the first transistor and is connected to one terminal of the programmable element via the second transistor, and the other terminal of the programmable element is connected to the second power terminal. The first transistor is turned on during the first and the second periods and turned off during the third period in response to the first control signal. The second transistor is turned off during the first period, turned on during the second period, and turned off during the third period in response to the second control signal.

According to this configuration, the storage node can be precharged to the logic "H" level, for example, from the power line VDD via the first transistor, before the second period starts, regardless of the presence or the absence of a program. Therefore, the determination as to whether or not there is a program during the second period can be performed stably.

In the program value determining circuit of the present invention, the latch means includes a third circuit connected between the intermediate connection node and the output node. The third circuit and the second circuit cooperate to make the intermediate connection node act as the storage node of the programmed value.

In this case, the third circuit is connected to the first and the second power terminals via signal lines that transmit third and fourth control signals for power supply. Furthermore, it is preferable that the first and the second control signals are delayed with respect to the third and the fourth control signals, the first and the second control signals have a logically inverse relationship, and the third and the fourth control signals have a logically inverse relationship.

According to this configuration, the current load of the latch means is disconnected from the storage node of the detecting portion at a time td before the second period starts, and the latch means latches the state of the storage node before it disappears at a time td before the second period ends. Thus, a stable operation of determining a programmed value can be achieved. These four control signals have a delay and a logically inverse relationship, so that they can be generated easily.

In the programmed value determining circuit of the present invention, a current flowing through the programmed value determining circuit during the third period is defined by the leak current of the latch means or the off-current of the first and the second switching elements.

According to another aspect of the present invention, a first semiconductor integrated circuit device of the present invention, for which an acceptable value of a leak current flowing per program element is set, includes the programmed value determining circuit of the present invention. The programmed value determining circuit determines that there is no program when a current flowing at a time of applying a voltage in a vicinity of a power voltage to the programmable element exceeds the acceptable value of the leak current, and determines that there is a program when the current is not more than the acceptable value of the leak current, and the programmed value determining circuit outputs either one of binary logic levels to a functional circuit as a result of the determination.

In this case, the first semiconductor integrated circuit device is a semiconductor memory device having a plurality of regular memory blocks and a redundant memory block. The functional circuit is a redundancy repair circuit for replacing a regular memory block with a defect by an adjacent regular memory block or the redundant memory block.

According to this configuration, when a fuse element is used as the programmable element in which it is determined that there is a program when the fuse element is cut by being blown with laser irradiation, a shift redundancy repair circuit to which the program value determining circuit without the problem of leak current is applied can be achieved, and power consumption during a stand-by time of the semiconductor memory can be reduced.

A second semiconductor integrated circuit device of the present invention, for which an acceptable value of a current flowing per programmable element is set, includes the programmed value determining circuit of the present invention. The programmed value determining circuit determines that there is no program when a current flowing at a time of applying a voltage in a vicinity of a power voltage to the programmable element is not more than the acceptable value of the current, and determines that there is a program when the current exceeds the acceptable value of the current, and the programmed value determining circuit outputs either one of binary logic levels to a functional circuit as a result of the determination.

In this case, the second semiconductor integrated circuit device is a semiconductor memory device having a plurality of regular memory blocks and a redundant memory block. The functional circuit is a redundancy repair circuit for replacing a regular memory block with a defect by an adjacent regular memory block or the redundant memory block.

According to this configuration, when an element in which it is determined that there is a program when the element is short-circuited by gate breakdown is used as the programmable element, this case has the opposite relationship in the leak current to the case where a fuse element is used as the programmable element.

A third semiconductor integrated circuit device of the present invention in which one chip is divided into a plurality of circuit blocks having different power systems includes a first circuit block and a second circuit block. In the first circuit block, a first programmed value determining circuit of the present invention is provided and power is turned repeatedly on and off. In the second circuit block, a second programmed value determining circuit having the same configuration as that of the first programmed value determining circuit is provided, and the number of times that power is turned off is lower than that in the first circuit block. The first programmed value determining circuit has at least one each of the first, the second and the third periods for only a predetermined period between power-on and power-off.

This configuration makes it possible to reduce power consumption significantly by applying the programmed value determining circuit without the problem of leak current to an LSI in which a power saving function is emphasized and power is turned repeatedly on and off with respect to a part of the mounted circuits.

A fourth semiconductor integrated circuit device in which one chip is divided into a plurality of circuit blocks having different power systems includes a first circuit block and a second circuit block. In the first circuit block, power is turned repeatedly on and off, and in the second circuit block, the number of times that power is turned off is lower than that in the first circuit block. The second circuit block includes a first programmed value determining circuit of the present invention corresponding to the first circuit block and a second programmed value determining circuit having the same configuration as that of the first programmed value determining circuit and corresponding to the second circuit block.

According to this configuration, the first and the second programmed value determining circuits are provided in the second circuit block in which the number of times that power is turned off is lower than that in the first circuit block, so that there is no possibility that the storage capability of the program may deteriorate, compared with the third semiconductor integrated circuit device in which a current flows through the programmable element every time power is turned on, and the reliability of the program can be improved and power saving can be promoted further.

A fifth semiconductor integrated circuit device of the present invention is of a multi-chip type and includes a plurality of chips including at least first and second chips. The second chip is attached to the surface of the first chip with its surface facing downward and is connected electrically. The first chip includes a first circuit block, and the second chip includes a second circuit block. The first circuit block includes a first programmed value determining circuit of the present invention corresponding to the first circuit block and a second programmed value determining circuit having the same configuration as that of the first programmed value determining circuit and corresponding to the second circuit block.

According to this configuration, in the semiconductor integrated circuit device having a chip-on-chip (COC) structure, in addition to the advantages of the programmed value determining circuit of the present invention, there is another advantage that a program can be provided easily by laser irradiation or the like with respect to the programmable element of the second programmed value determining circuit, for example, for the purpose of performing redundancy repair with respect to a memory block included in the second circuit block, even after the second chip is attached to the surface of the first chip with its surface facing downward.

In the third to the fifth semiconductor integrated circuit devices, the timings of the first and the second control signals are different among a plurality of programmed value determining circuits including the first and the second programmed value determining circuits.

This configuration makes it possible to prevent the logic level determination of the storage node from malfunctioning due to current flowing simultaneously through the plurality of programmable elements and the subsequent voltage drop during the second period.

A sixth semiconductor integrated circuit device of the present invention is of a multi-chip type in which a chip module including a plurality of chips arranged in a plane is mounted on a substrate. The plurality of chips have a plurality of corresponding circuit blocks, and a circuit block located nearest to a power circuit configured on the substrate of the plurality of circuit blocks includes a first programmed value determining circuit of the present invention corresponding to this circuit block and a second programmed value determining circuit having the same configuration as that of the first programmed value determining circuit and corresponding to another circuit block.

This configuration can provide the following advantages, in addition to the advantages of the programmed value determining circuit of the present invention. In the semiconductor integrated circuit device in which a multichip module (MCM) is mounted on a substrate, a plurality of programmed value determining circuits are integrated onto one chip so that the programmable elements of the programmed value determining circuits can be provided with a program easily. Furthermore, if the chip in which a plurality of programmed value determining circuits are integrated is located nearest to the power circuit that generates a high voltage or a large current, a high voltage or a large current can be supplied easily without requiring an extra area or an additional process for increasing the withstand voltage when determining a programmed value, compared with the case in which the programmed value determining circuits are distributed.

It is preferable that in the sixth semiconductor integrated circuit device, the timings of the first and the second control signals are different among a plurality of programmed value determining circuits including the first and second programmed value determining circuits.

This configuration makes it possible to prevent the logic level determination of the storage node from malfunctioning due to current flowing simultaneously through the plurality of programmable elements and the subsequent voltage drop during the second period.

According to another aspect of the present invention, a method for determining a programmed value uses a programmable element whose resistance is changed depending on whether or not there is a program, a first circuit, a second circuit, and latch means. The first circuit includes first and second switching elements that operate in response to first and second control signals respectively, and are connected to the programmable element in series between a first power terminal and a second power terminal. At least the first switching element is inserted between the first power terminal and an intermediate connection node. At least the second switching element connected to the programmable element in series is inserted between the intermediate connection node and the second power terminal. The second circuit converts an electric potential at the intermediate connection node to a logic level and outputs it to an output node. The latch means latches the electric potential at the intermediate connection node and makes the intermediate connection node act as a storage node of a programmed value of the programmable element. The method includes the steps of turning at least the second switching element on, connecting the storage node to the second power terminal via the programmable element, and detecting the state of the storage node by the first and the second circuits during the second period subsequent to the first period after power is turned on; and turning both the first and the second switching elements off, and holding the state of the storage node by the latch means during a third period after the second period.

According to this method, the second period during which the state of the program of the programmable element is detected is restricted to a predetermined period during power-on, and only during this period, the storage node of the programmed value is connected to one power terminal via the programmable element. However, during the other periods including the first and the third periods, the storage node is disconnected therefrom, and the programmable element is disconnected completely from leak paths between the power terminals. Thus, the relationship of a trade-off between the area of the programmable element and the leak current can be eliminated, so that both the area of the programmable element and the leak current can be reduced.

DESCRIPTION OF THE PREFERRED EMBODIMENTS

Hereinafter, the preferred embodiments of the present invention will be described with reference to the accompanying drawings.

First, the concept of the present invention will be described before specific embodiments are described. The present invention is applied to a system LSI that has to include a large number of programmable elements without causing a leak current during the stand-by time, which will be required in the forthcoming portable equipment applications or the like. For this purpose, the present invention has the following features.

(1) The following control is performed. The period during which the state of the program of the programmable element is detected is restricted to a predetermined period during power-on, and only during that period, a storage node of a programmed value is connected to at least one power terminal via the programmable element, but is disconnected therefrom during the other periods. Furthermore, the programmable element is disconnected completely from leak paths between the power terminals.

Furthermore, by providing means for latching the state of the storage node of a programmed value, the programmed value can be held by the latch means, even if the storage node of the programmed value is disconnected completely from the power terminals.

(2) In the case of an LSI in which a power saving function is emphasized and power is turned repeatedly on and off with respect to a part of mounted circuits, the above-described control (1) is repeated for only the programmed value determining circuit that is mounted on a circuit block in which power is turned repeatedly on and off. The above-described control (1) can be repeated also for a programmed value determining circuit that is mounted on a circuit block in which power is not turned off, in synchronization with the operation of the programmed value determining circuit that is mounted on a circuit block in which power is turned off. To the contrary, all the programmed value determining circuits may be connected to the power line in which power is not turned off.

Next, specific embodiments will be described based on the concept of the present invention described above.

First Embodiment

Figure 1B:
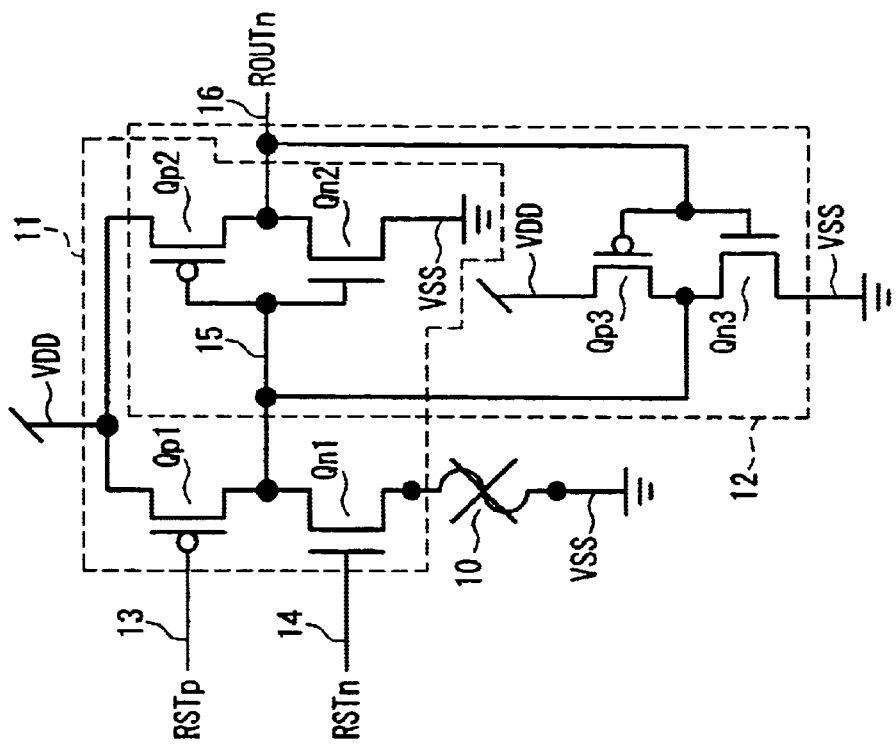
FIG. 1B is a circuit diagram of an example of the configuration of a programmed value determining circuit of the first embodiment of the present invention, showing the state in which there is a program.
Figure 1A:
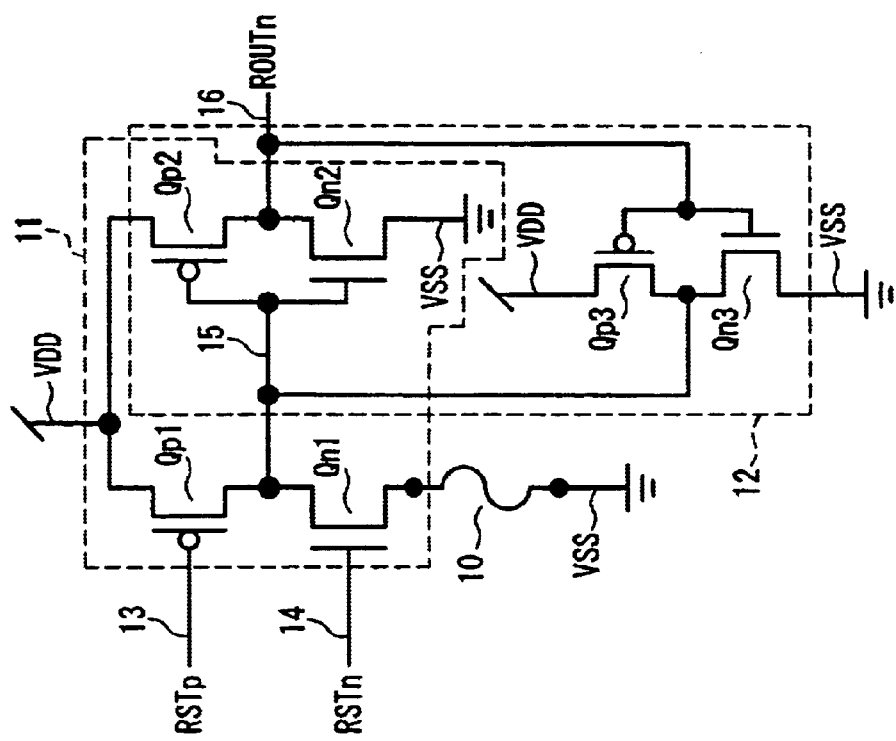
FIG. 1A is a circuit diagram of an example of the configuration of a programmed value determining circuit of a first embodiment of the present invention, showing the state in which there is no program.

FIGS. 1A and 1B are circuit diagrams of an example of the configuration of a programmed value determining circuit of a first embodiment of the present invention, showing the states in which there is no program and in which there is a program, respectively.

In FIGS. 1A and 1B, the programmed value determining circuit is configured so as to include a programmable element 10 (e.g., a fuse element that can be blown with laser, or a fuse element that can be melted and cut by high voltage application), a detecting portion 11 for detecting whether or not there is a program based on the resistance change of the program element 10 in response to a first control signal RSTp and a second control signal RSTn applied to a first control line 13 and a second control line 14, respectively, and a latch portion 12 for latching the level of a storage node 15.

The detecting portion 11 includes a PMOS transistor Qp1 (first switching element), an NMOS transistor Qn1 (second switching element), a PMOS transistor Qp2, and an NMOS transistor Qn2. In the PMOS transistor Qp1, the gate is connected to the first control line 13, the source is connected to a power line VDD, and the drain is connected to the storage node 15. In the NMOS transistor Qn1, the gate is connected to the second control line 14, the source is connected to one terminal of the program element 10, and the drain is connected to the storage node 15. In the PMOS transistor Qp2, the gate is connected to the storage node 15, the source is connected to the power line VDD, and the drain is connected to an output node 16. In the NMOS transistor Qn2, the gate is connected to the storage node 15, the source is connected to a ground line VSS, and the drain is connected to the output node 16.

In other words, the detecting portion 11 is constituted with two-staged inverters, which are an inverter including the PMOS transistor Qp1 and the NMOS transistor Qn1 that are connected in series, and an inverter including the PMOS transistor Qp2 and the NMOS transistor Qn2 that are connected in series.

The other terminal of the programmable element is connected to a ground line VSS.

In this embodiment, the programmable element 10 is connected between the NMOS transistor Qn1 and the ground line VSS, but it will be appreciated by those skilled in the art that the present invention also can be applied to the case where the programmable element is inserted in another location between the power line VDD and the ground line VSS.

The latch portion 12 includes a PMOS transistor Qp3 and an NMOS transistor Qn3. In the PMOS transistor Qp3, the gate is connected to the output node 16, the source is connected to a power line VDD, and the drain is connected to the storage node 15. In the NMOS transistor Qn3, the gate is connected to the output node 16, the source is connected to a ground line VSS, and the drain is connected to the storage node 15.

In other words, the latch portion 12 is constituted with an inverter that conducts a feedback from the output node 16 to the storage node 15, in which the PMOS transistor Qp3 and the NMOS transistor Qn3 are connected in series, and the inverter including the PMOS transistor Qp2 and the NMOS transistor Qn2 that are connected in series.

Next, the operation of the programmed value determining circuit configured in this manner will be described with reference to FIG. 2.

Figure 2:
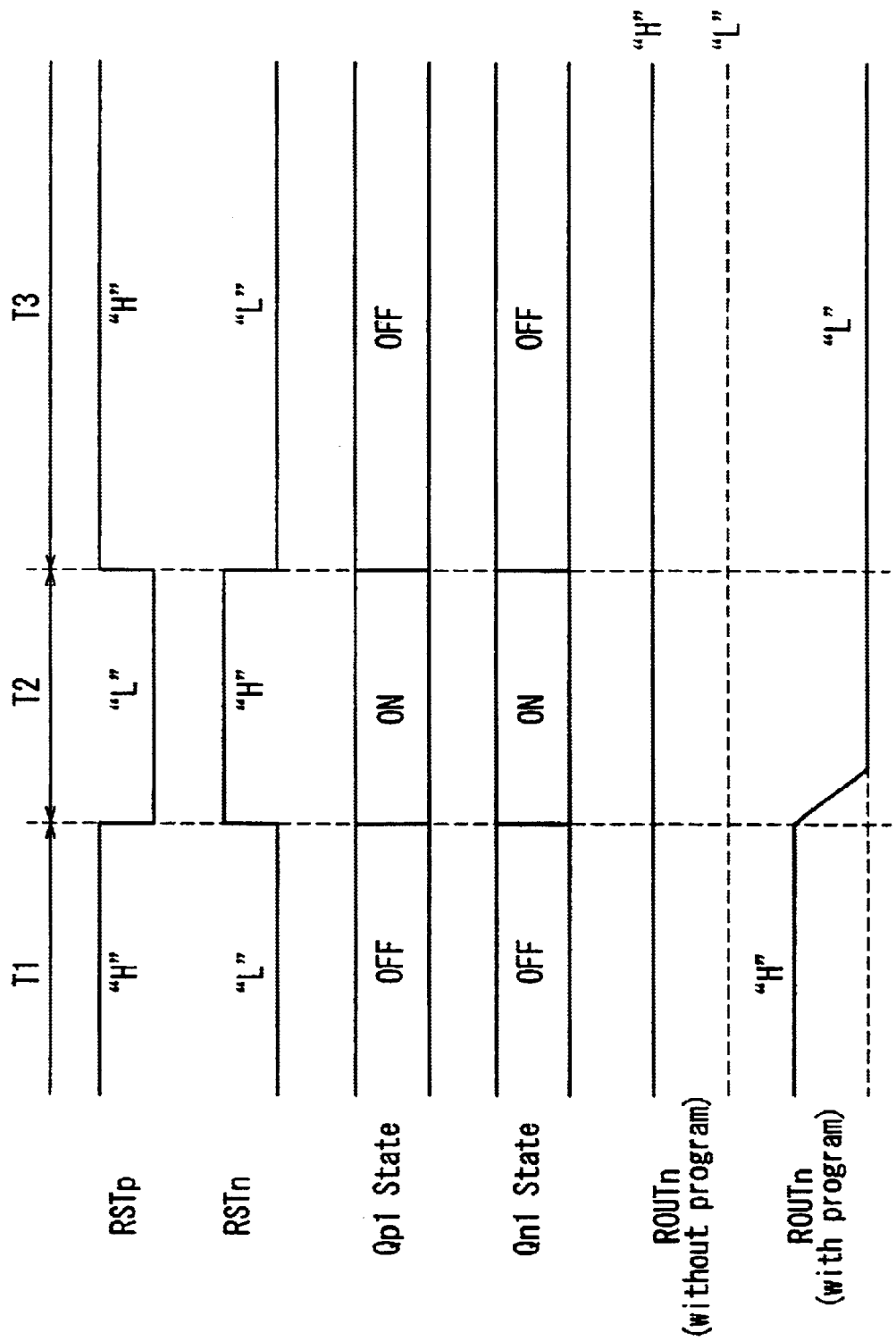
FIG. 2 is a timing chart for determination as to whether or not there is a program with the configuration of FIGS. 1A and 1B.

FIG. 2 is a timing chart for determination with respect to whether or not there is a program with the above-described configuration. As shown in FIG. 2, first, during a period T1, the first control signal RSTp is in a logic "H" level, the second control signal RSTn is in a logic "L" level, and both the PMOS transistor Qp1 and the NMOS transistor Qn1 are off. Therefore, the storage node 15 is in the logic "L" level, regardless of the presence or the absence of a program, and the output signal ROUTn to the output node 16 is in the logic "H" level.

Next, at the start of a period T2 (determination period), when the first control signal RSTp is transitioned from the logic "H" level to the logic "L" level, and the second control signal RSTn is transitioned from the logic "L" level to the logic "H" level, then both the PMOS transistor Qp1 and the NMOS transistor Qn1 are turned on. At this time, in the case where the fuse element as the programmable element 10 is connected, that is, the state in which there is no program (FIG. 1A), the storage node 15 remains in the logic "L" level, so that the output signal ROUTn also remains in the "H" level.

On the other hand, in the case where the fuse element as the programmable element 10 is cut off, that is, the state in which there is a program (FIG. 1B), when both the PMOS transistor Qp1 and the NMOS transistor Qn1 are turned on, then the storage node 15 is transitioned from the logic "L" level to the logic "H" level, and the output signal ROUTn is transitioned from the logic "H" level to the logic "L" level.

During the subsequent period T3, the first control signal RSTp is transitioned to the "H" level, and the second control signal RSTn is transitioned to the logic "L" level, and both the PMOS transistor Qp1 and the NMOS transistor Qn1 are turned off. At this time, since the level of the storage node 15 is held by the latch portion 12, the output signal ROUTn maintains the "H" level in the case where there is no program, and the output signal ROUTn maintains the "L" level in the case where there is a program.

Therefore, during the period T2, it can be determined that there is no program when the output signal ROUTn is in the "H" level, and it can be determined that there is a program when the output signal ROUTn is in the "L" level.

Thus, only during the determination period T2 of the presence or absence of a program, pulse signals are generated as the first control signal RSTp and the second control signal RSTn, and both the PMOS transistor Qp1 and the NMOS transistor Qn1 are turned on. During the other periods T1 and T3, both the PMOS transistor Qp1 and the NMOS transistor Qn1 are turned off.

Thus, since both the PMOS transistor Qp1 and the NMOS transistor Qn1 are off during a period such as a stand-by period, during which a leak current otherwise may be problematic, the leak current does not occur at all even if the programmable element 10 has a residual resistance of several k ohms after blowing.

Figure 12A:
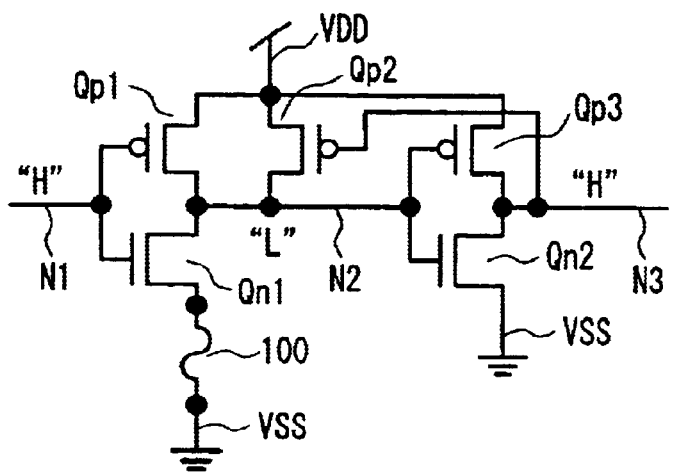
FIG. 12A is a circuit diagram of an example of the configuration of a conventional programmed value determining circuit, showing the state in which there is no program before blowing the fuse element 100.
Figure 12B:
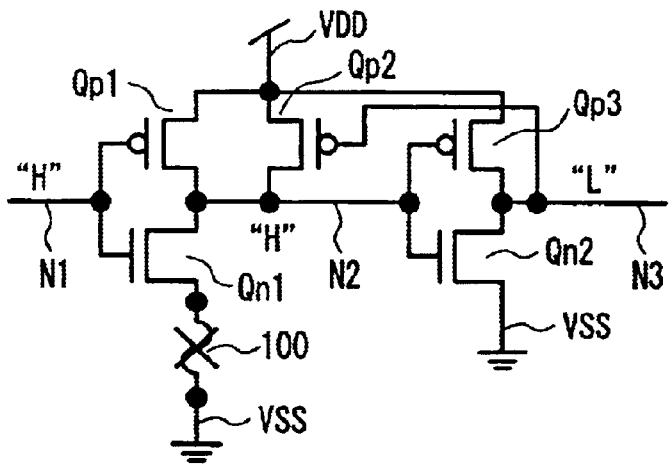
FIG. 12B is a circuit diagram of an example of the configuration of the conventional programmed value determining circuit, showing the state in which there is a program after the fuse element 100 has been blown with a high laser power.
Figure 12C:
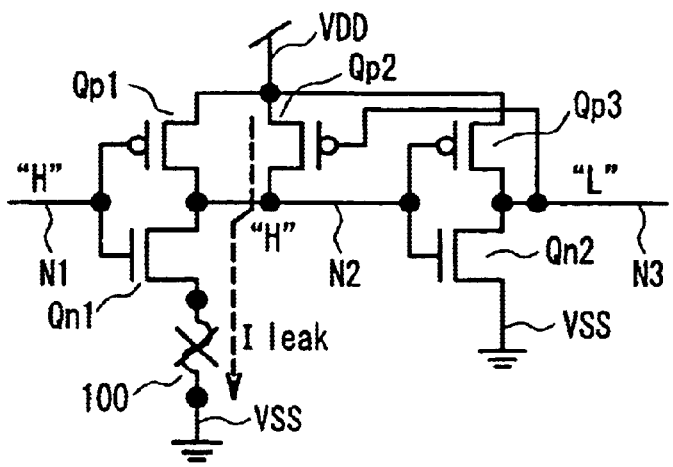
FIG. 12C is a circuit diagram of an example of the configuration of the conventional programmed value determining circuit, showing the state in which there is a program after the fuse element 100 has been blown with a low laser power.
Figure 13:
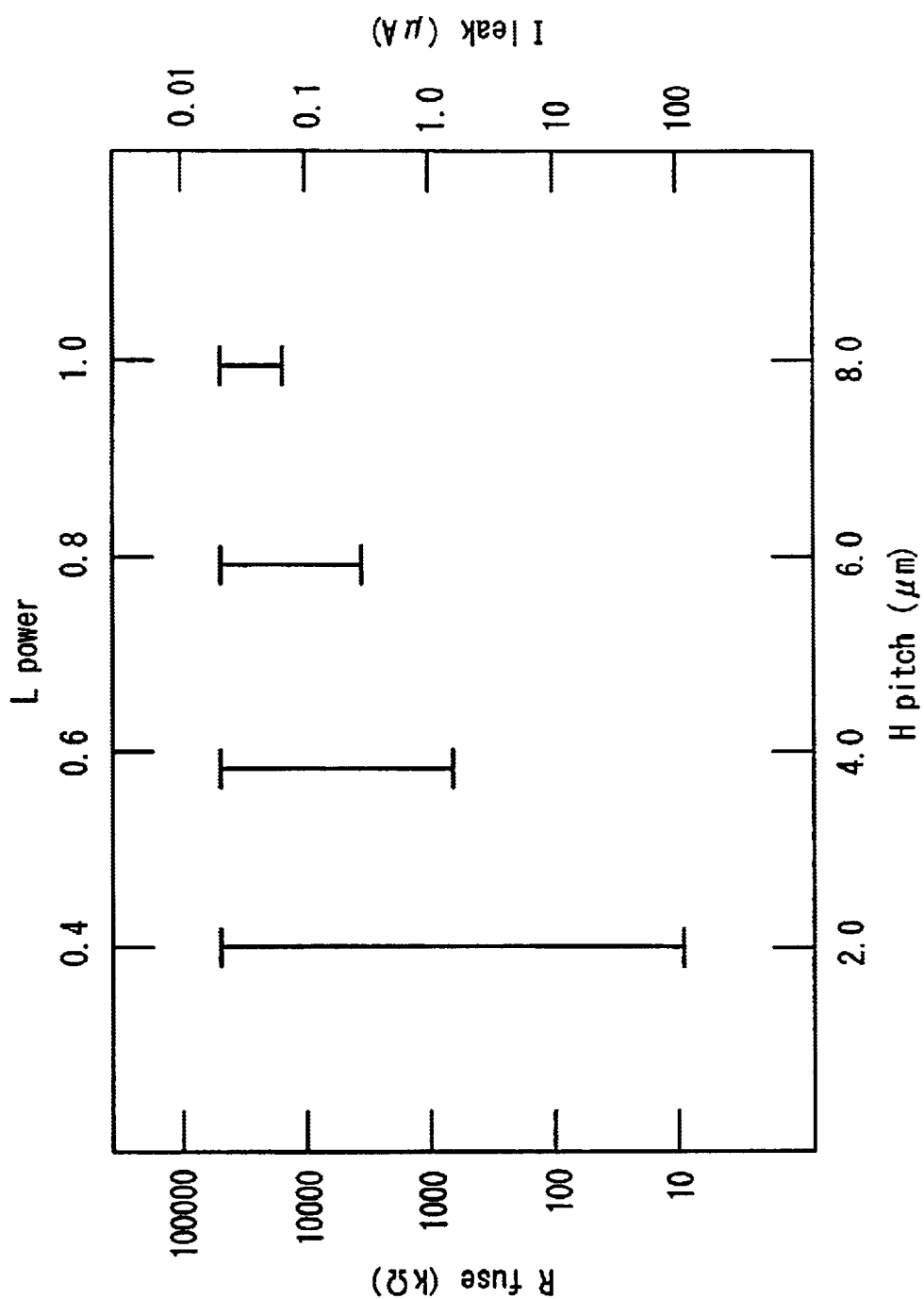
FIG. 13 is a graph showing the relationship of the residual resistance Rfuse and the leak current Ileak after the fuse element 100 has been blown, with respect to the fuse pitch Hpitch and the relative laser power Lpower in the configuration of FIGS. 12A, 12B and 12C.

In the conventional configuration as shown in FIGS. 12A, 12B and 12C, in the case where latching is performed with the PMOS transistor Qp2, the NMOS transistor Qn1 has to be on. Therefore, as shown in FIG. 12C, when the storage node N2 is in the logic "H" level, the leak current Ileak flows, as long as the residual resistance is present in the programmable element 100. Therefore, in order to suppress the leak current Ileak, it is necessary to reduce the current capability of the PMOS transistor Qp2 that latches the logic "H" level of the storage node N2, and consequently, when a residual resistance is present even to some extent, the storage node N2 is affected significantly by the ground line VSS side and is turned to the logic "L" level, so that there is a large possibility that providing a program fails.

However, according to the present invention, the problem of a leak current is solved, so that it is possible to increase the current capability of the PMOS transistor Qp1, and consequently, even if the residual resistance is present to some extent, providing a program does not fail as opposed to the conventional configuration.

Second Embodiment

The second embodiment of the present invention has the same circuit configuration as that of the first embodiment but is different therefrom in the method for controlling the PMOS transistor Qp1 and the NMOS transistor Qn1 with the first control signal RSTp and the second control signal RSTn, respectively.

Figure 3:
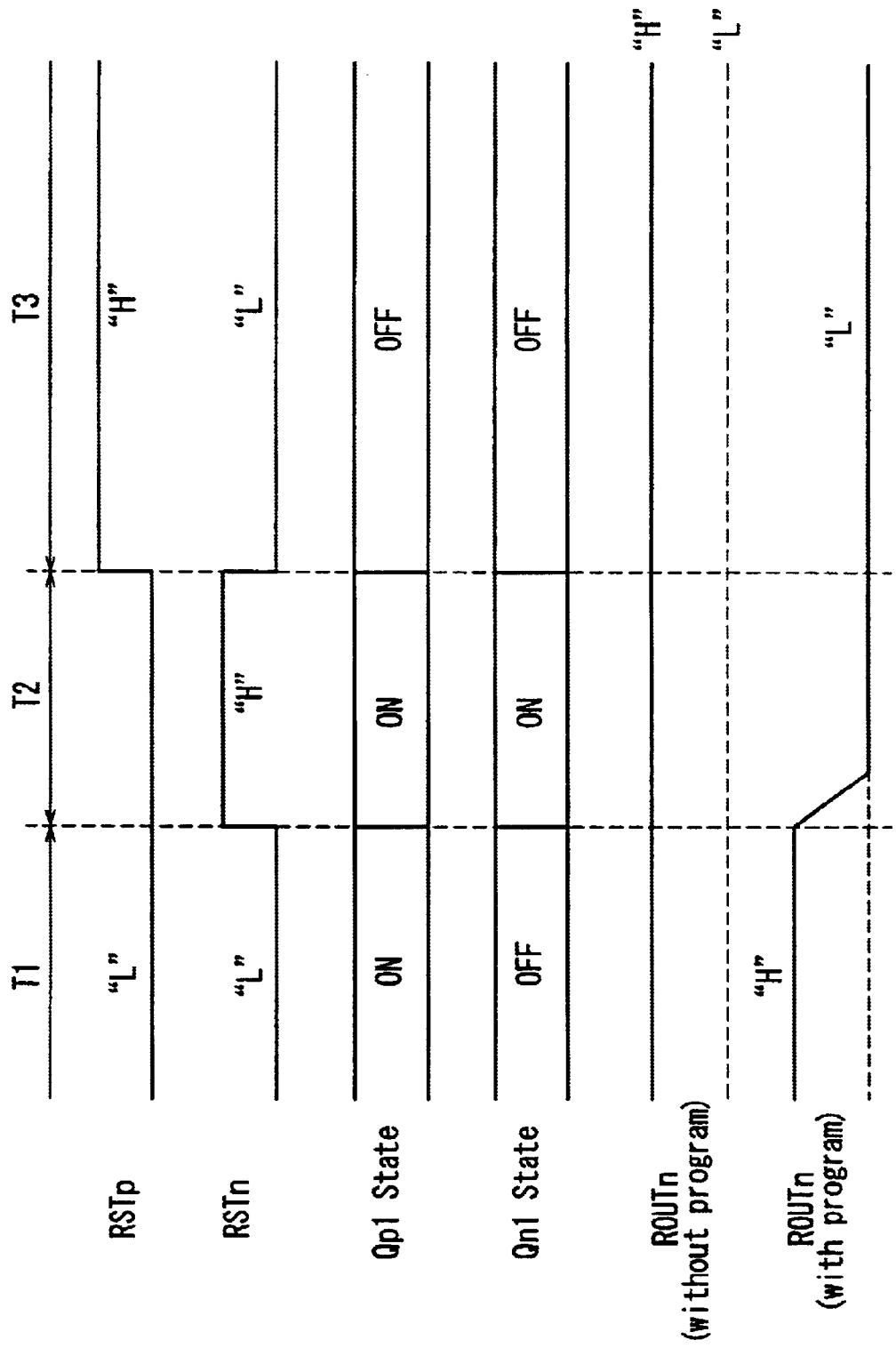
FIG. 3 is a timing chart for determination as to whether or not there is a program in a second embodiment of the present invention, using a programmed value determining circuit having the same configuration as that of FIGS. 1A and 1B.

FIG. 3 is a timing chart for determination as to whether or not there is a program in the second embodiment of the present invention. As shown in FIG. 3, this embodiment is different from the first embodiment shown in FIG. 2 in that during the period T1 after power is turned on, both the first control signal RSTp and the second control signal RSTn are turned to the logic "L" level, so that the PMOS transistor Qp1 is turned on and the NMOS transistor Qn1 is turned off.

This difference makes it possible that the storage node 15 is precharged to the logic "H" level from the power line VDD via the PMOS transistor Qp1 before the determination period T2, regardless of the presence or the absence of a program. Thus, only the PMOS transistor Qp3, which is a feedback transistor included in the latch portion 12, is turned on, and the precharge current of the storage node 15 by the PMOS transistor Qp1 and the current load condition of the feedback transistor Qp3 before the determination period T2 become constant, so that it can be determined more stably whether or not there is a program during the period T2.

Third Embodiment

Figure 4B:
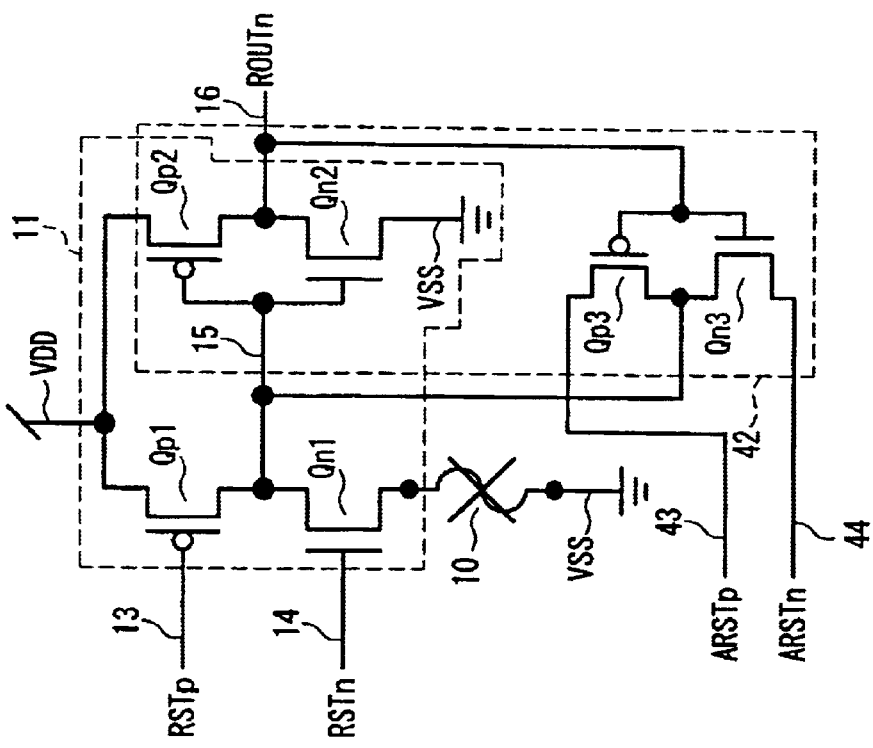
FIG. 4B is a circuit diagram of an example of the configuration of the programmed value determining circuit of the third embodiment of the present invention, showing the state in which there is a program.
Figure 4A:
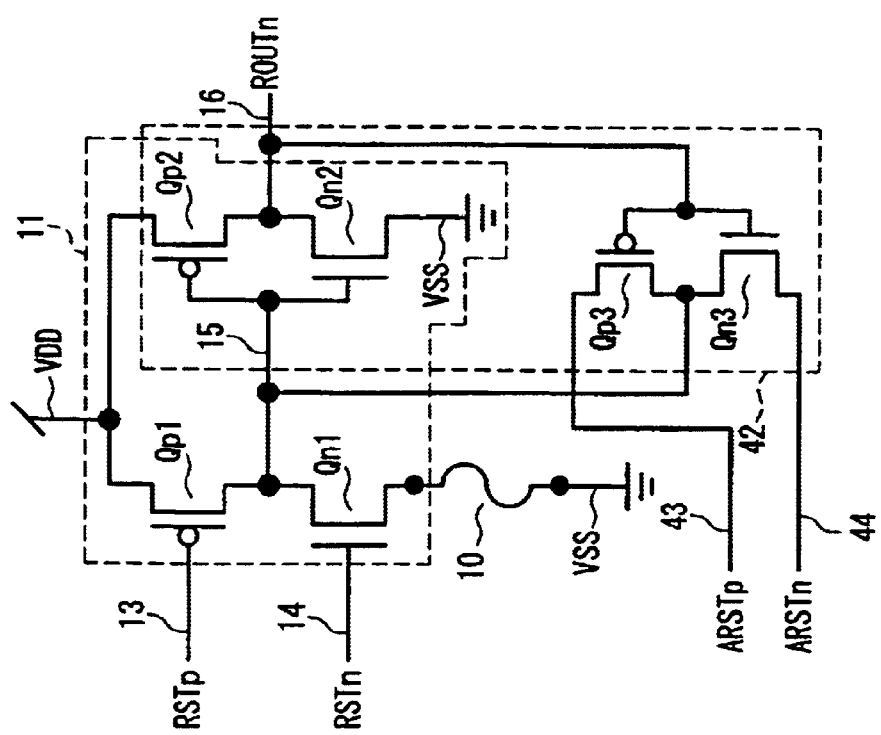
FIG. 4A is a circuit diagram of an example of the configuration of a programmed value determining circuit of a third embodiment of the present invention, showing the state in which there is no program.

FIGS. 4A and 4B are circuit diagrams of an example of the configuration of a programmed value determining circuit of a third embodiment of the present invention, showing the states in which there is no program and in which there is a program, respectively. This embodiment is different from the first and the second embodiments in the configuration of the latch portion.

In FIGS. 4A and 4B, the latch portion 42 includes a PMOS transistor Qp3 and an NMOS transistor Qn3. In the PMOS transistor Qp3, the gate is connected to the output node 16, the source is connected to a third control line 43, and the drain is connected to the storage node 15. In the NMOS transistor Qn3, the gate is connected to the output node 16, the source is connected to a fourth control line 44, and the drain is connected to the storage node 15.

In other words, in the latch portion 42, power is supplied to the PMOS transistor Qp3 and the NMOS transistor Qn3 constituting a feedback inverter by the third control signal ARSTp via the third control line 43 and the fourth control signal ARSTn via the fourth control line 44, respectively.

This configuration makes it possible to eliminate the influence of the feedback transistors Qp3 and Qn3 as current loads during the determination time as to whether or not there is a program without increasing the number of the transistors.

Figure 5A:
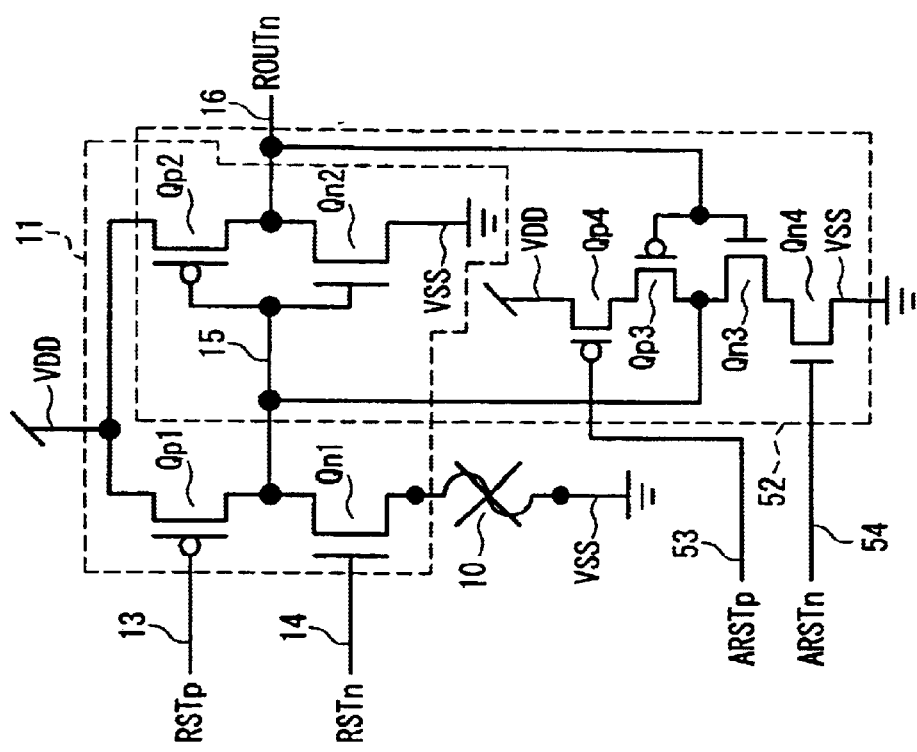
FIG. 5A is a circuit diagram of another example of the configuration of the programmed value determining circuit of the third embodiment of the present invention, showing the state in which there is no program.
Figure 5B:
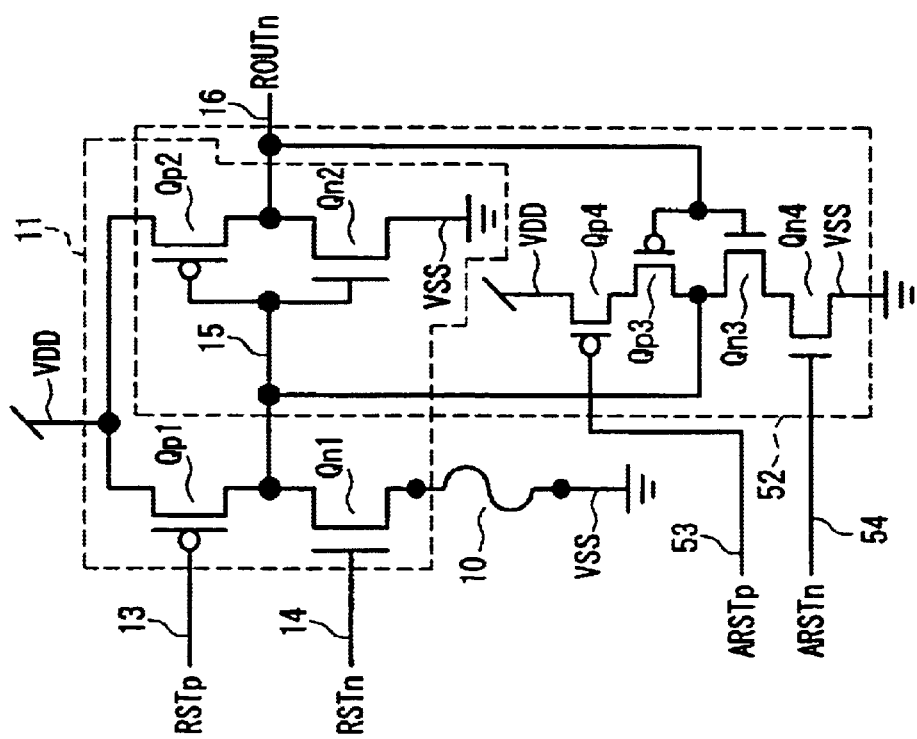
FIG. 5B is a circuit diagram of another example of the configuration of the programmed value determining circuit of the third embodiment of the present invention, showing the state in which there is a program.

FIGS. 5A and 5B are circuit diagrams of another example of the configuration of a programmed value determining circuit of the third embodiment of the present invention, showing the states in which there is no program and in which there is a program, respectively. This embodiment is different from the first and the second embodiments in the configuration of the latch portion.

In FIGS. 5A and 5B, the latch portion 52 includes a PMOS transistor Qp3, an NMOS transistor Qn3, a PMOS transistor Qp4, and an NMOS transistor Qn4. In the PMOS transistor Qp3, the gate is connected to the output node 16, and the drain is connected to the storage node 15. In the NMOS transistor Qn3, the gate is connected to the output node 16, and the drain is connected to the storage node 15. In the PMOS transistor Qp4, the gate is connected to a third control line 53, the source is connected to a power line VDD, and the drain is connected to the source of the PMOS transistor Qp3. In the NMOS transistor Qn4, the gate is connected to a fourth control line 54, the source is connected to a ground line VSS, and the drain is connected to the source of the NMOS transistor Qn3.

In other words, in the latch portion 52, the feedback transistors Qp3 and Qn3 operate as a tri-state inverter by controlling the PMOS transistor Qp4 and the NMOS transistor Qn4 to be on and off with the third control signal ARSTp and the fourth control signal ARSTn, respectively.

According to this configuration, although the number of transistors is increased, the third control signal ARSTP and the fourth control signal ARSTn do not have to supply power, and only have to drive the gates of the PMOS transistor Qp4 and the NMOS transistor Qn4, respectively. Therefore, compared with the configurations of FIGS. 4A and 4B, the driving load of the third control signal ARSTp and the fourth control signal ARSTn can be small.

Figure 6:
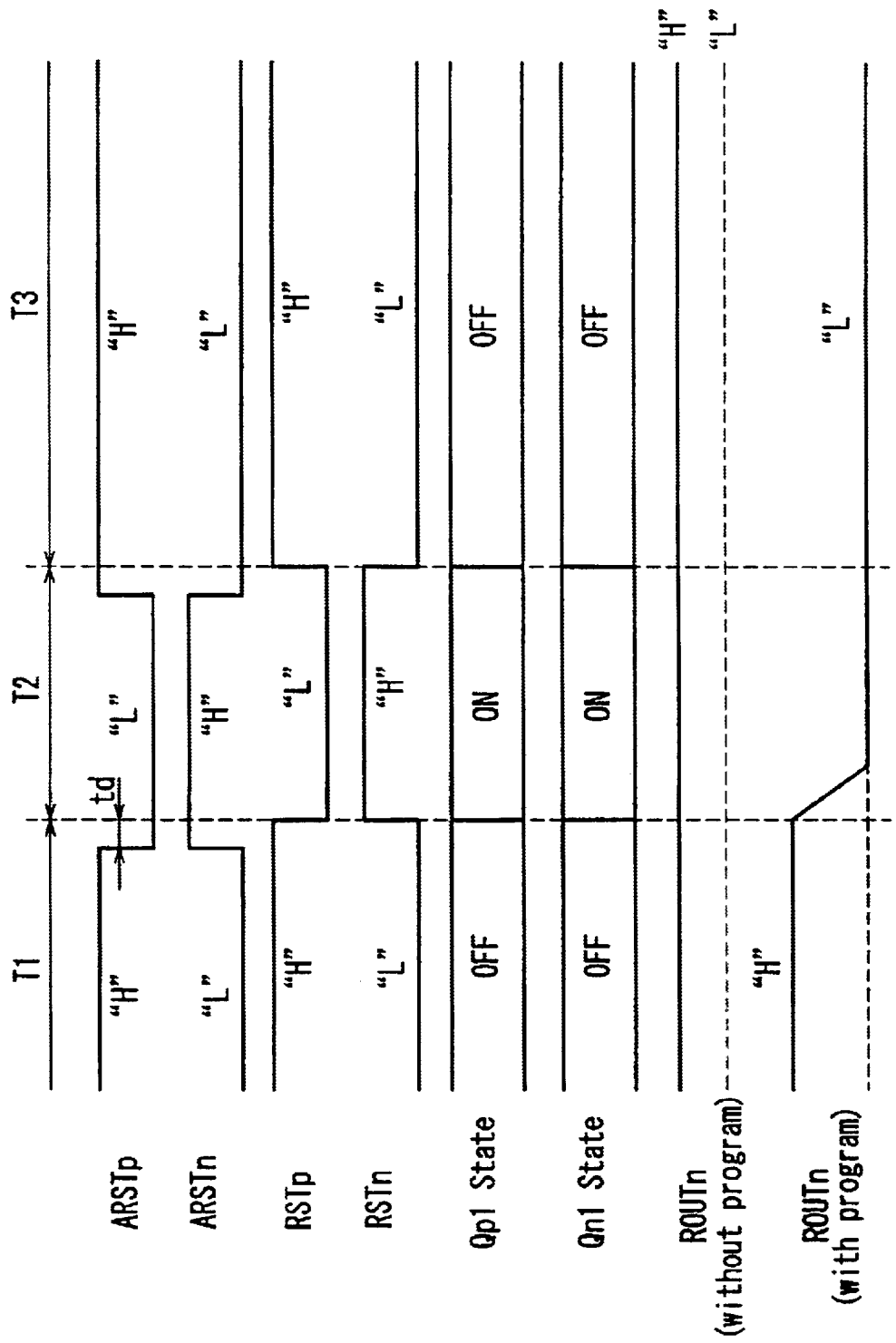
FIG. 6 is a timing chart for determination as to whether or not there is a program with the configurations of FIGS. 4A, 4B, 5A and 5B.

FIG. 6 is a timing chart for determination as to whether or not there is a program that is used commonly for the configurations shown in FIGS. 4A, 4B, 5A and 5B. In FIG. 6, the timing relationship of the first control signal RSTp, the second control signal RSTn and the output signal ROUTn is the same as that of FIG. 2, but the timings of the third control signal ARSTp and the fourth control signal ARSTn are earlier than those of the first control signal RSTp and the second control signal RSTn, respectively, by a time td. These four control signals have an inverse relationship and a delay time of td with respect to the corresponding control signals, so that they can be generated easily.

The timing relationship as described above makes it possible to disconnect the current load of the feedback transistors Qp3 and Qn3 included in the latch portions 42 and 52 from the storage node 15 of the detecting portion 11 at a time td before entering the determination period T2, and to latch the state of the storage node 15 before its state disappear, at the time td before the determination period T2 ends. This can achieve a stable operation for programmed value determination.

The above embodiment has been illustrated and described, assuming that a part of the detecting portion functions also as a part of the latch portion, but it will be appreciated by those skilled in the art that various modifications, such as the latch portion being configured without using a part of the detecting portion, can be made within the scope of the present invention.

Fourth Embodiment

Figure 7:
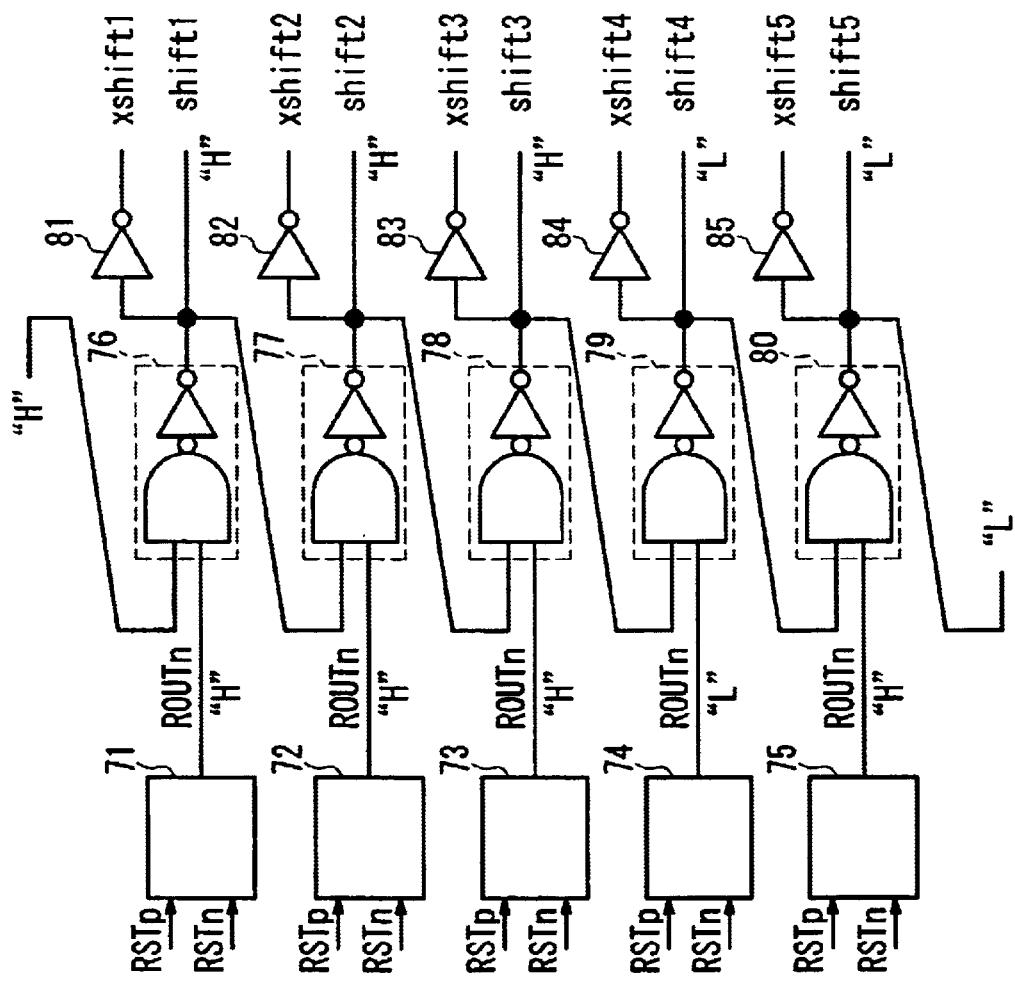
FIG. 7 is a circuit block diagram showing an example of the configuration of a shift signal generating circuit to which the programmed value determining circuit of a fourth embodiment of the present invention is applied.
Figure 8:
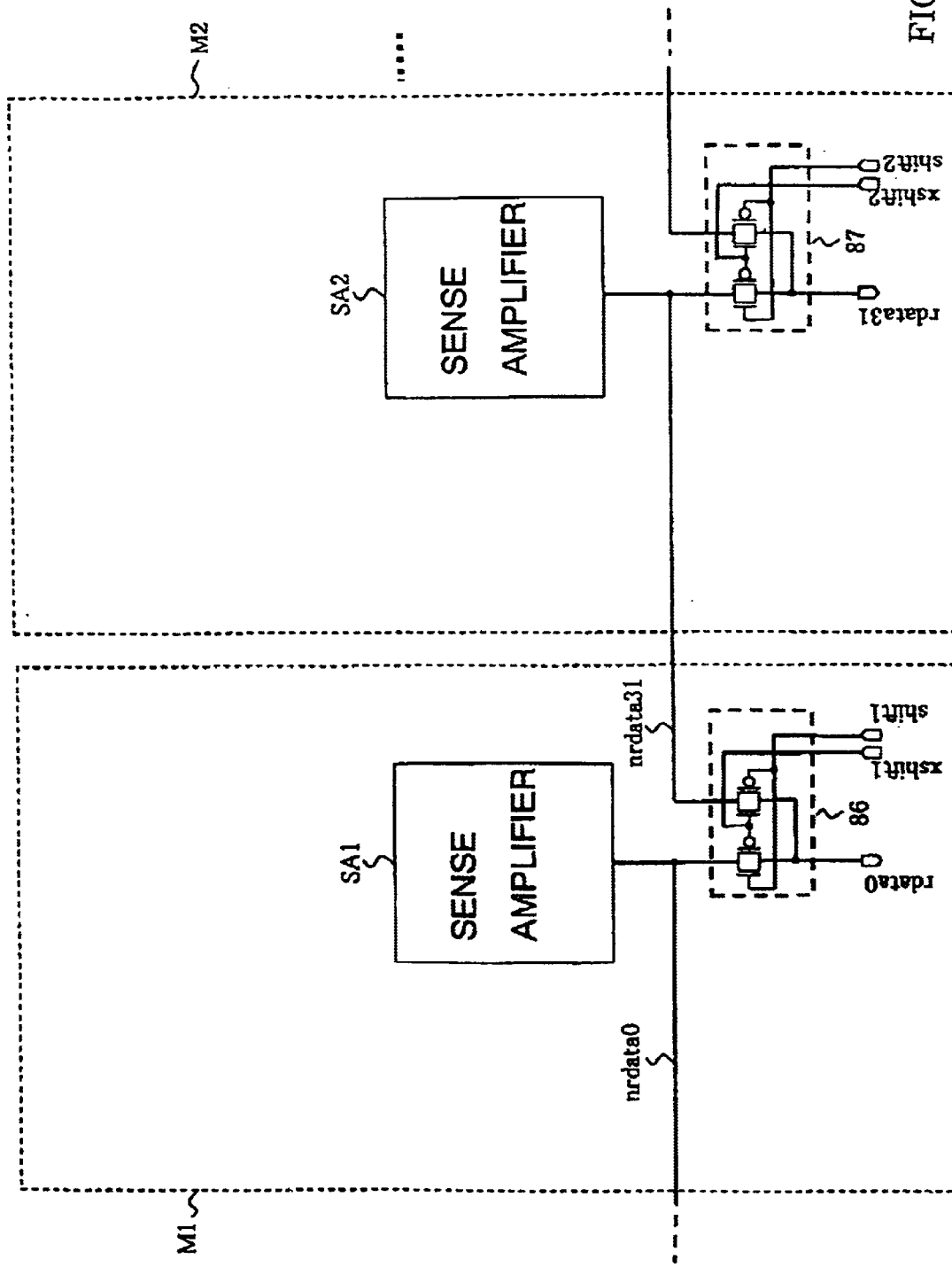
FIG. 8 is a circuit diagram showing an example of the configuration of a redundancy repair circuit of a semiconductor memory to which a shift signal shift and an inverted shift signal xshift from the shift signal generating circuit of FIG. 7 are supplied.

The fourth embodiment of the present invention describes the programmed value determining circuit shown in FIGS. 1A and 1B that is applied to a redundancy repair circuit of a semiconductor memory with reference to FIGS. 7 and 8. The programmed value determining circuit shown in FIGS. 4A and 4B or FIGS. 5A and 5B can be applied to a redundancy repair circuit.

FIG. 7 is a circuit block diagram showing an example of the configuration of a shift signal generating circuit in which a memory cell array of a semiconductor memory is divided into a plurality of regular memory blocks and one redundant memory block, and that replaces a regular memory block having a defective address by the adjacent regular memory block or the redundant memory block.

In FIG. 7, the shift signal generating circuit includes a plurality of programmed value determining circuits 71 to 75, a plurality of AND circuits 76 to 80, and a plurality of logic inverting circuits 81 to 85. The output signals ROUTn of the programmed value determining circuits 71 to 75 are input to one input terminal of the AND circuits 76 to 80, respectively, and the output signals from the AND circuits corresponding to the adjacent memory blocks are input to the other input terminal thereof. Then, shift signals shift1 to shift5 are output from the AND circuits 76 to 80, respectively. The shift signals shift1 to shift5 from the AND circuits 76 to 80 are inverted by the logic inverting circuits 81 to 85, and inverted shift signals xshift1 to xshift5 are generated.

In this configuration, with respect to the normal regular memory blocks without defective addresses, the programmable elements in the programmed value determining circuits 71, 72, 73, and 75 are connected, that is, the state in which there is no program, and all the output signals ROUTn from the programmed value determining circuits 71, 72, 73 and 75 are in the logic "H" level. Therefore, the shift signals shift1, shift2, and shift3 are in the logic "H" level.

However, with respect to abnormal regular memory blocks having defective addresses, the programmable element in the programmed value determining circuit 74 is cut off, that is, the state in which there is a program, and the output signal ROUTn from the programmed value determining circuit 74 is in the logic "L" level, so that the shift signal shift4 is in the logic "L" level. Since the shift signal shift4 with the logic "L" level is input to the adjacent AND circuit 80, the shift signal shift5 also is in the logic "L" level.

Thus, the shift signals are all in the logic "H" level before the programmed value determining circuit 74 corresponding to the memory block having a defective address, but all the shift signals of the programmed value determining circuit 74 and the following program value determining circuits are turned to the logic "L" level.

The shift signals shift1, shift2 and the inverted shift signals xshift1 xshift2 are input to memory blocks M1, M2 shown in FIG. 8 (in FIG. 8, only shift1, xshift1, shift2, and xshift2 are shown.) Sense amplifier output selecting circuits 86 and 87 provided in an I/O unit select a sense amplifier outputs nrdataO and nrdata31 from sense amplifiers SA1 and SA2 to be coupled to outputs rdata and rdata31 respectively (of the memory block of their own), when the shift signals shift1 and shift1 are in the logic "H" level. The sense amplifier output selecting circuits 86 and 87 each can be shifted so as to select a sense amplifier output of the right neighboring memory block having no defective address. For example the sense amplifier output selecting circuit 86 can be shifted so as to select the sense amplifier output nrdata31 when the shift signal shift1 is in the logic "L" level.

This technique is called a shift redundancy technique, and redundancy repair can be performed without compromising the access time due to address determination, and this technique is widely well known. The present invention also can be applied to this technique.

As described above, this embodiment can provide a shift redundancy repair circuit to which the programmed value determining circuit in which the problem of the leak current is not caused is applied, which has not existed so far. The programmed value determining circuit of the present invention can be utilized in such a redundancy repair circuit, but there is no limitation regarding the application.

Fifth Embodiment

Next, the fifth embodiment describes a semiconductor integrated circuit device (hereinafter, referred to as "LSI") in which power is turned repeatedly on and off partially with respect to the circuit block because of an emphasis on the power saving function, in which the programmed value determining circuits of the first, the second and the third embodiments are mounted.

Figure 9A:
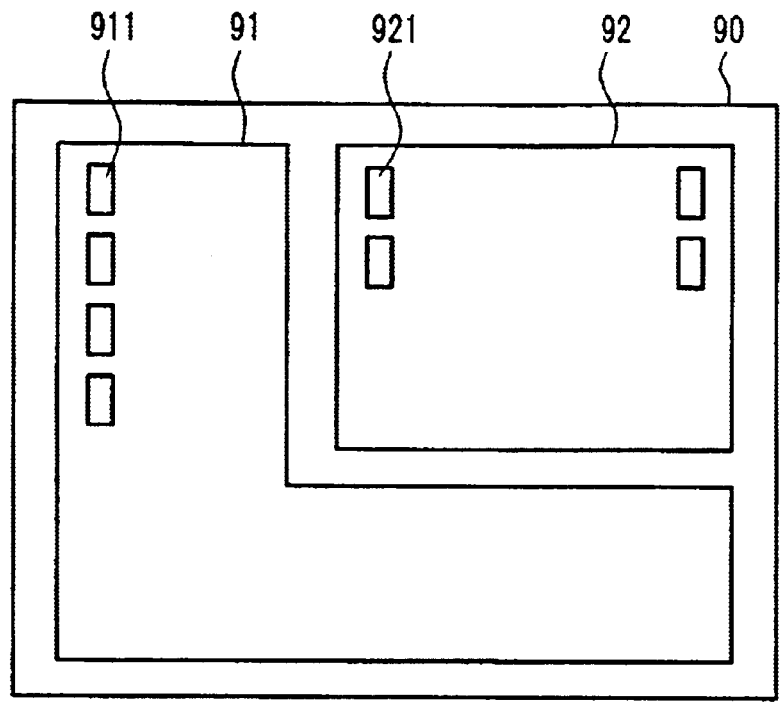
FIG. 9A is a schematic plan view showing an example of the configuration of a semiconductor integrated circuit device of a fifth embodiment of the present invention.

FIG. 9A is a schematic plan view showing an example of the configuration of a semiconductor integrated circuit device of the fifth embodiment of the present invention. In FIG. 9A, a LSI 90 includes a first circuit block 91 in which power is turned repeatedly on and off and a second circuit 92 in which power-off is not performed.

In this case, a first programmed value determining circuit 911 provided in the first circuit block 91 in which power is turned repeatedly on and off repeats the determination of programmed values by determining whether or not there is a program of the programmable element for only a predetermined period during power-on, using the first control signal RSTp and the second control signal RSTn (and the third control signal ARSTp and the fourth control signal ARSTn, when the programmed value determining circuit of the third embodiment is mounted).

On the other hand, a second programmed value determining circuit 921 provided in the second circuit block 92 in which power is not turned off determines a programmed value only once at a predetermined timing during power-on.

The second programmed value determining circuit 921 provided in the second circuit block 92 in which power is not turned off can repeat to determine a programmed value in synchronization with the operation of the first programmed value determining circuit 911 provided in the first circuit block 91 in which power is turned repeatedly on and off.

Figure 9B:
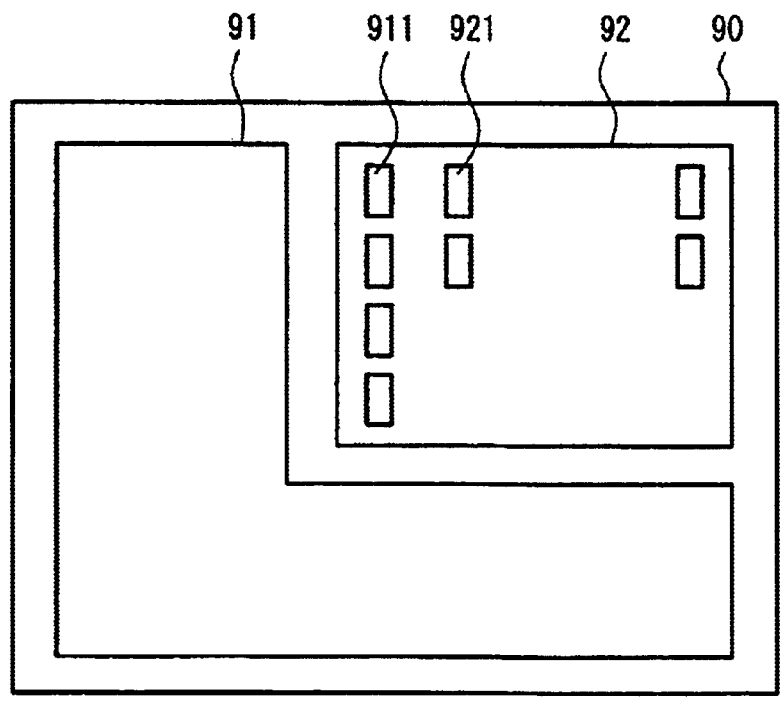
FIG. 9B is a schematic plan view showing another example of the configuration of the semiconductor integrated circuit device of the fifth embodiment of the present invention.

FIG. 9B is a schematic plan view showing an example of another configuration of the semiconductor integrated circuit device of the fifth embodiment of the present invention.

In the configuration shown in FIG. 9A, the first circuit block 91 in which power is turned repeatedly on and off includes the corresponding first programmed value determining circuit 911. On the other hand, in the configuration shown in FIG. 9B, the second circuit block 92 in which power is not turned off includes the first programmed value determining circuit 911 corresponding to the first circuit block 91. The other respects in the configuration are the same as those in FIG. 9A.

In the configuration of FIG. 9B, both the first programmed value determining circuit 911 and the second programmed value determining circuit 921 are provided in the second circuit block 92 in which power is not turned off, so that the advantage is even larger when it is used in the application in which power is turned repeatedly on and off frequently or used in the application in which programmed value determination cannot be performed without letting a large current flow or applying a high voltage.

In other words, the reliability of the program can be improved without the possibility that the number of times that a current flows may increase for determination of the programmed value, thereby deteriorating the storage capability of the programmable element. Furthermore, power saving can be promoted further because it is sufficient to let a large current flow or apply a high voltage only once for programmed value determination.

This embodiment has been described, assuming that power-off is not conducted in the second circuit block 92, but the circuit block 92 can be configured such that the number of power-off is lower than that in the first circuit block 91.

Sixth Embodiment

Next, the sixth embodiment describes a semiconductor integrated circuit device having a chip-on-chip (COC) structure in which the programmed value determining circuits of the first, the second and the third embodiments are mounted.

Figure 10A:
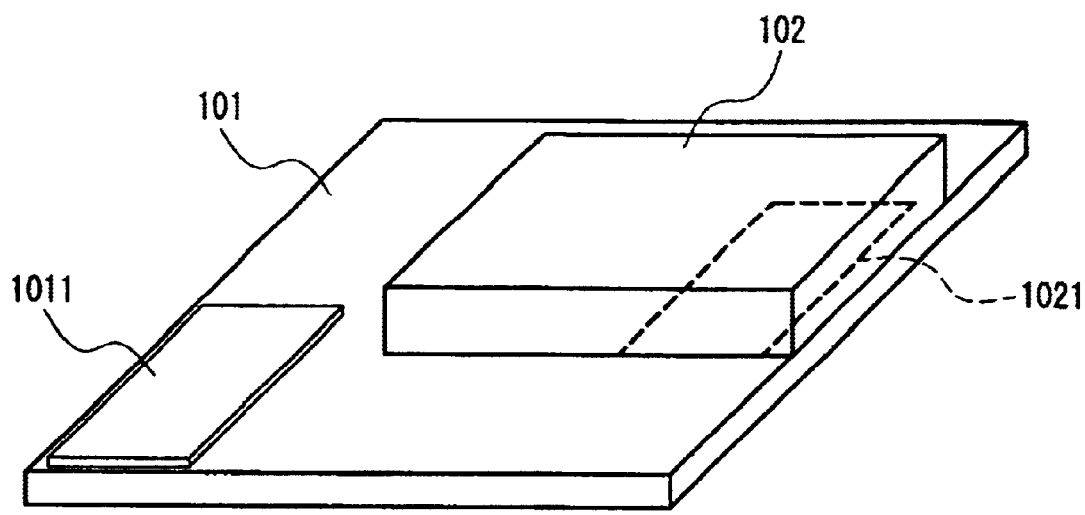
FIG. 10A is a schematic perspective view showing an example of the configuration of a semiconductor integrated circuit device with a COC structure of a sixth embodiment of the present invention.

FIG. 10A is a schematic perspective view showing an example of the configuration of a semiconductor integrated circuit device having a COC structure of the sixth embodiment of the present invention. In FIG. 10A, a second chip 102 is attached to the surface of a first chip 101 with its surface facing downward and is connected electrically. A first memory block 1011 included in a first circuit block is configured in the first chip 101, and a second memory block 1021 included in a second circuit block is configured in the second chip 102.

Figure 10B:
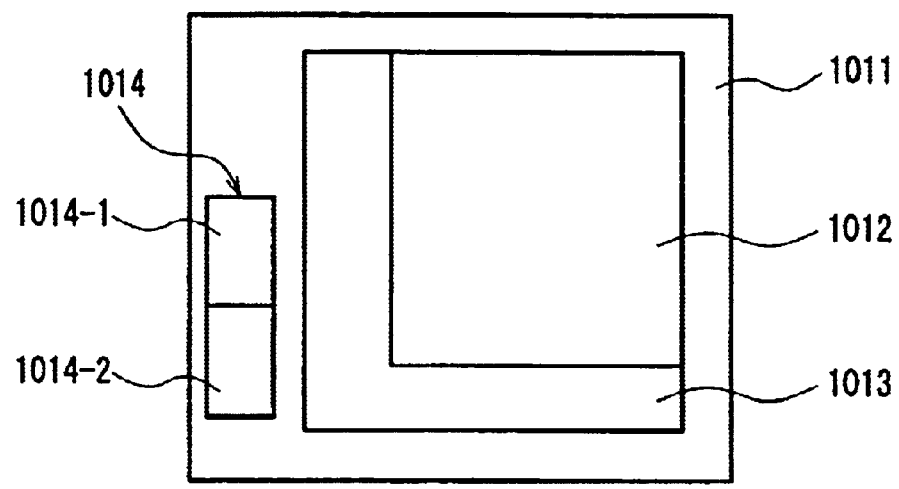
FIG. 10B is a schematic plan view showing the internal configuration of the first memory block 1011 shown in FIG. 10A.

FIG. 10B is a schematic plan view showing the internal configuration of the first memory block 1011 shown in FIG. 10A. In FIG. 10B, the first memory block 1011 includes a memory array 1012, a memory peripheral circuit 1013, and a programmed value determining circuit 1014. The programmed value determining circuit 1014 includes a first programmed value determining circuit 1014-1 for redundancy repair with respect to the first memory block 1011 and a second programmed value determining circuit 1014-2 for redundancy repair with respect to the second memory block 1021.

This configuration makes it possible to provide a program easily by laser irradiation or the like to the programmable element of the second programmed value determining circuit 1014-2, when redundancy repair is performed with respect to the second memory block 1021, even after the second chip 102 is attached to the surface of the first chip 101 with its surface facing downward.

Seventh Embodiment

Next, the seventh embodiment describes a semiconductor integrated circuit device in which the programmed value determining circuits of the first, the second and the third embodiments are mounted on a multi-chip-module (MCM).

Figure 11A:
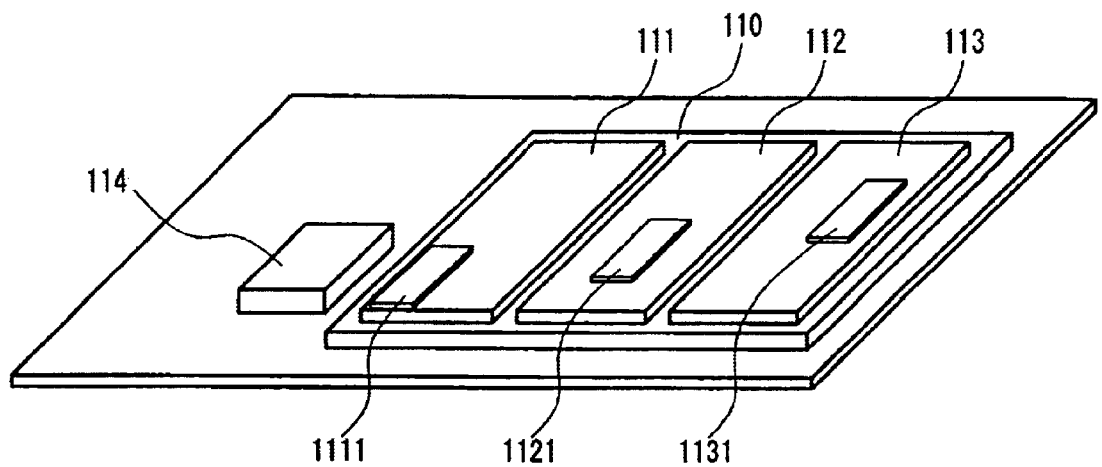
FIG. 11A is a schematic perspective view showing an example of the configuration of a semiconductor integrated circuit device on which an MCM is mounted of a seventh embodiment of the present invention.

FIG. 11A is a schematic perspective view showing an example of the configuration of a semiconductor integrated circuit device having a MCM of the seventh embodiment of the present invention. In FIG. 11A, an MCM 110 is configured by arranging a first chip 111, a second chip 112, and a third chip 113 on a plane with a high density, and is mounted on a substrate. A first memory block 1111, a second memory block 1121, and a third memory block 1131 are configured in the first chip 111, the second chip 112, and the third chip 113, respectively. A power circuit 114 that generates a large current or a high voltage is mounted on the substrate.

Figure 11B:
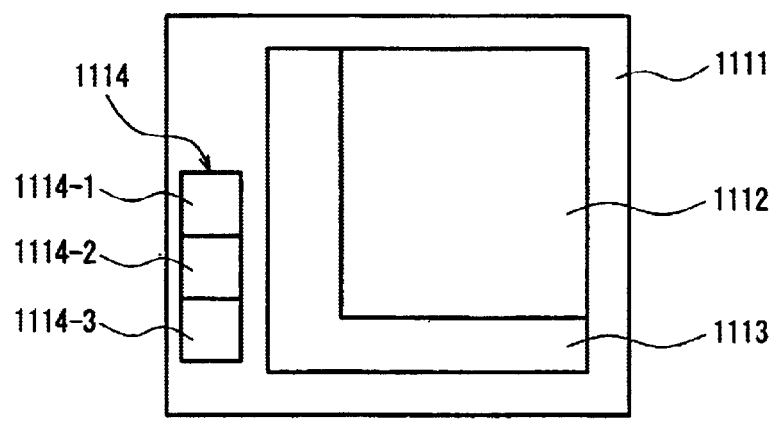
FIG. 11B is a schematic plan view showing the internal configuration of the first memory block 1111 shown in FIG. 11A.

FIG. 11B is a schematic plan view showing the internal configuration of the first memory block 1111 shown in FIG. 11A. In FIG. 11B, the first memory block 1111 includes a memory array 1112, a memory peripheral circuit 1113, and a programmed value determining circuit 1114. The programmed value determining circuit 1114 includes a first programmed value determining circuit 1114-1 for redundancy repair with respect to the first memory block 1111, a second programmed value determining circuit 1114-2 for redundancy repair with respect to the second memory block 1121, and a third programmed value determining circuit 1114-3 for redundancy repair with respect to the second memory block 1131.

Thus, in addition to the first programmed value determining circuit 1114-1, the second programmed value determining circuit 1114-2 and the third programmed value determining circuit 1114-3 are configured in the first memory block 1111 that is provided in the nearest position to the power circuit 114.

In this configuration, a plurality of programmed value determining circuits are integrated onto one chip, so that a program can be provided easily by laser irradiation or the like to the programmable elements of the programmed value determining circuits. Furthermore, the chip onto which a plurality of programmed value determining circuits are integrated is located nearest to the power circuit 114 that generates a high voltage or a large current, so that a high voltage and a large current can be supplied easily for programmed value determination, without requiring an extra area or an additional process for raising the withstand voltage, compared with the case in which the programmed value determining circuits are distributed.

The above embodiments have been described by taking the fuse element that is blown by laser irradiation to be open, which indicates that there is a program, as an example of the programmable element. However, the present invention is not limited thereto, and for example, an element that can be short-circuited by gate breakdown, which indicates that there is a program, can be used. When this case is applied to the first embodiment, the storage node is maintained in the logic "H" level when there is no program, and is maintained in the logic "L" level when there is a program. Thus, the relationship in the leak current is opposite to the case where the fuse element is used.

In the above embodiments, a current flowing during a power saving mode (third period) is defined by a leak current of the latch portion from which power cannot be disconnected or by the off-current of the PMOS transistor Qp1 (first switching element) and the NMOS transistor Qn1 (second switching element) whose resistances are changed in response to the first control signal RSTp and the second control signal RSTn.

In the fifth and the sixth embodiments, it is preferable that when a plurality of programmed value determining circuits are provided, the timing of the first control signal RSTp and the second control signal RSTn supplied to each programmed value determining circuit is different from that of the other programmed value determining circuits. This can prevent the malfunction of the storage node in logic level determination, which otherwise might be caused by current flowing through the plurality of programmed value determining circuits at the same time so that a voltage drops.

As described above, the present invention makes it possible to provide a programmed value determining circuit in which the relationship of a trade-off between the area of the programmable element and the leak current is eliminated, and both the area of the programmable element and the leak current are reduced, a semiconductor integrated circuit device having such a programmed value determining circuit, and a method for determining a programmed value. Thus, an optimal technique for a system LSI that has to include a large number of programmable elements without causing a leak current during the stand-by time, which is desired by the forthcoming portable equipment, can be provided.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A programmed value determining circuit comprising:
    a programmable element whose resistance is changed depending on whether or not there is a program;
    a detecting portion including a first circuit and a second circuit,
    the first circuit including first and second switching elements that operate in response to first and second control signals respectively, the first and second switching elements and the programmable element being connected in series between a first power terminal and a second power terminal such that
    at least the first switching element is inserted between the first power terminal and an intermediate connection node, and
    at least the second switching element connected to the programmable element in series is inserted between the intermediate connection node and the second power terminal, and
    the second circuit converting an electric potential at the intermediate connection node to a logic level and outputting it to an output node; and
    latch means for latching the electric potential at the intermediate connection node to make the intermediate connection node act as a storage node of a programmed value of the programmable element,
    wherein during a second period subsequent to a first period after power is turned on, at least the second switching element is turned on, the storage node is connected to the second power terminal via the programmable element, and a state of the storage node is detected by the detecting portion, and
    during a third period after the second period, both the first and the second switching elements are turned off, and the state of the storage node is held by the latch means.

2. The programmed value determining circuit according to claim 1, wherein
    during the first and the third periods, opposite terminals of the programmable element are disconnected from at least one of the first and the second power terminals, and
    during the second period, each of the opposite terminals of the programmable element is connected to the first or the second power terminal directly or via the first or the second switching element.

3. The programmed value determining circuit according to claim 1, wherein
    the first switching element is constituted by a first transistor controlled by the first control signal, and the second switching element is constituted by a second transistor controlled by the second control signal,
    the storage node is connected to the first power terminal via the first transistor and is connected to one terminal of the programmable element via the second transistor, and the other terminal of the programmable element is connected to the second power terminal,
    The first transistor is turned off during the first period, turned on during the second period, and turned off during the third period in response to the first control signal, and
    the second transistor is turned off during the first period, turned on during the second period, and turned off during the third period in response to the second control signal.

4. The programmed value determining circuit according to claim 1, wherein
    the first switching element is constituted by a first transistor controlled by the first control signal, and the second switching element is constituted by a second transistor whose driving is controlled by the second control signal,
    the storage node is connected to the first power terminal via the first transistor and is connected to one terminal of the programmable element via the second transistor, and the other terminal of the programmable element is connected to the second power terminal,
    the first transistor is turned on during the first and the second periods and turned off during the third period in response to the first control signal, and
    the second transistor is turned off during the first period, turned on during the second period, and turned off during the third period in response to the second control signal.

5. The programmed value determining circuit according to claim 1, wherein
the latch means includes a third circuit connected between the intermediate connection node and the output node, and the third circuit and the second circuit cooperate to make the intermediate connection node act as the storage node of the programmed value.

6. The programmed value determining circuit according to claim 5, wherein
the third circuit is connected to the first and the second power terminals via signal lines that transmit third and fourth control signals for power supply.

7. The programmed value determining circuit according to claim 5, wherein
the first and the second control signals are delayed with respect to the third and the fourth control signals, the first and the second control signals have a logically inverse relationship, and the third and the fourth control signals have a logically inverse relationship.

8. The programmed value determining circuit according to claim 1, wherein
a current flowing through the programmed value determining circuit during the third period is defined by a leak current of the latch means.

9. The programmed value determining circuit according to claim 1, wherein
a current flowing through the programmed value determining circuit during the third period is defined by an off-current of the first and the second switching elements.

10. A semiconductor integrated circuit device for which an acceptable value of a leak current flowing per program element is set, comprising a programmed value determining circuit including:
a programmable element whose resistance is changed depending on whether or not there is a program;
a detecting portion including a first circuit and a second circuit,
the first circuit including first and second switching elements that operate in response to first and second control signals respectively, the first and second switching elements and the programmable element being connected in series between a first power terminal and a second power terminal such that
at least the first switching element is inserted between the first power terminal and an intermediate connection node, and
at least the second switching element connected to the programmable element is series is inserted between the intermediate connection node and the second power terminal, and
the second circuit converting an electric potential at the intermediate connection ode to a logic level and outputting it to an output node; and
latch means for latching the electric potential at the intermediate connection node to make the intermediate connection node act as a storage node of a programmed value of the programmable element, wherein
during a second period subsequent to a first period after power is turned on, at least the second switching element is turned on, the storage node is connected to the second power terminal via the programmable element, and a state of the storage node is detected by the detecting portion, and
during a third period after the second period, both the first and the second switching elements are turned off, and the state of the storage node is held by the latch means,
wherein the programmed value determining circuit determines that there is no program when a current flowing at a time of applying a voltage in a vicinity of a power voltage to the programmable element exceeds the acceptable value of the leak current, and determines that there is a program when the current is not more than the acceptable value of the leak current, and the programmed value determining circuit outputs either one of binary logic levels to a functional circuit as a result of the determination.

11. The semiconductor integrated circuit device according to claim 10, wherein the semiconductor integrated circuit device is a semiconductor memory device having a plurality of regular memory blocks and a redundant memory block, and
wherein the functional circuit is a redundancy repair circuit for replacing a regular memory block with a defect by an adjacent regular memory block or the redundant memory block.

12. A semiconductor integrated circuit device for which an acceptable value of a current flowing per programmable element is set, comprising a programmed value determining circuit including:
a programmable element whose resistance is changed depending on whether or not there is a program;
a detecting portion including a first circuit and a second circuit,
the first circuit including first and second switching elements that operate in response to first and second control signals respectively, the first and second switching elements and the programmable element being connected in series between a first power terminal and a second power terminal such that
at least the first switching element is inserted between the first power terminal and an intermediate connection node, and at least the second switching element connected to the programmable element is series is inserted between the intermediate connection node and the second power terminal, and
the second circuit converting an electric potential at the intermediate connection node to a logic level and outputting it to an output node; and
latch means for latching the electric potential at the intermediate connection node to make the intermediate connection node act as a storage node of a programmed value of the programmable element, wherein
during a second period subsequent to a first period after power is turned on, at least the second switching element is turned on, the storage node is connected to the second power terminal via the programmable element, and a state of the storage node is detected by the detecting portion, and
during a third period after the second period, both the first and the second switching elements are turned off, and the state of the storage node is held by the latch means,
wherein the programmed value determining circuit determines that there is no program when a current flowing at a time of applying a voltage in a vicinity of a power voltage to the programmable element is not more than the acceptable value of the current, and determines that there is a program when the current exceeds the acceptable value of the current, and the programmed value determining circuit outputs either one of binary logic levels to a functional circuit as a result of the determination.

13. The semiconductor integrated circuit device according to claim 12, wherein the semiconductor integrated circuit device is a semiconductor memory device having a plurality of regular memory blocks and a redundant memory block, and wherein the functional circuit is a redundancy repair circuit for replacing a regular memory block with a defect by an adjacent regular memory block or the redundant memory block.

14. A semiconductor integrated circuit device in which one chip is divided into a plurality of circuit blocks having different power systems, comprising:

a first circuit block wherein a first programmed value determining circuit is provided and power is turned repeatedly on and off the programmed value determining circuit comprising:

a programmable element whose resistance is changed depending on whether or not there is a program;

a detecting portion including a first circuit and a second circuit, the first circuit including first and second switching elements that operate in response to first and second control signals respectively, the first and second switching elements and the programmable element being connected in series between a first power terminal and a second power terminal such that at least the first switching element is inserted between the first power terminal and an intermediate connection node, and at least the second switching element connected to the programmable element in series is inserted between the intermediate connection node and the second power terminal, and the second circuit converting an electric potential at the intermediate connection node to a logic level and outputting it to an output node; and latch means for latching the electric potential at the intermediate connection node to make the intermediate connection node act as a storage node of a programmed value of the programmable element, wherein during a second period subsequent to a first period after power is turned on, at least the second switching element is turned on, the storage node is connected to the second power terminal via the programmable element, and a state of the storage node is detected by the detecting portion, and during a third period after the second period, both the first and the second switching elements are turned off, and the state of the storage node is held by the latch means; and a second circuit block in which a second programmed value determining circuit having a same configuration as that of the first programmed value determining circuit is provided, and the number of times that power is turned off is lower than that in the first circuit block, wherein the first programmed value determining circuit has at least one each of the first, the second and the third period for only a predetermined period between power-on and power off.

15. The semiconductor integrated circuit device according to claim 14, wherein timings of the first and the second control signals are different among a plurality of programmed value determining circuits including the first and the second programmed value determining circuits.

16. A semiconductor integrated circuit device in which one chip is divided into a plurality of circuit blocks having different power systems, comprising a first circuit block wherein power is turned repeatedly on and off; and a second circuit block in which the number of times that power is turned off is lower than that in the first circuit block, the second circuit block comprising:

the first programmed value determining circuit corresponding to the first circuit block including:

a programmable element whose resistance is changed depending on whether or not there is a program, a detecting portion including a first circuit and a second circuit, the first circuit including first and second switching elements that operate in response to first and second control signals respectively, the first and second switching elements and the programmable element being connected in series between a first power terminal and a s second power terminal such that at least the first switching element is inserted between the first power terminal and an intermediate connection node, and at least the second switching element connected to the programmable element in series is inserted between the intermediate connection node and the second power terminal, and the second circuit converting an electric potential at the intermediate connection node to a logic level and outputting it to an output node; and latch means for latching the electric potential at the intermediate connection node to make the intermediate connection node act as a storage node of a programmed value of the programmable element, wherein during a second period subsequent to a first period after power is turned on, at least the second switching element is turned on, the storage node is connected to the second power terminal via the programmable element, and a state of the storage node is detected by the detecting portion, and during a third period after the second period, both the first and the second switching elements are turned off, and the state of the storage node is held by the latch means; and a second programmed value determining circuit having a same configuration as that of the first programmed value determining circuit and corresponding to the second circuit block.

17. The semiconductor integrated circuit device according to claim 16, wherein timings of the first and the second control signals are different among a plurality of a programmed value determining circuits including the first and the second programmed value determining circuits.

18. A semiconductor integrated circuit device of a multichip type comprising:

a plurality of chips including at least first and second chips, wherein the second chip is attached to a surface of the first chip with its surface facing downward and is connected electrically, the first chip including a first circuit block, and the second chip including a second circuit block, the first circuit block including:

a first programmed value determining circuit corresponding to the first circuit block including:

a programmable element whose resistance is changed depending on whether or not there is a program, a detecting portion including a first circuit and a second circuit, the first circuit including first and second switching elements that operate in response to first and second control signals respectively, the first and second switching elements and the programmable element being connected in series between a first power terminal and a second terminal such that at least the first switching element is inserted between the first power terminal and an intermediate connection node, and at least the second switching element connected to the programmable element in series is inserted between the intermediate connection node and the second power terminal, and the second circuit converting an electric potential at the intermediate connection node to a logic level and outputting it to an output node; and latch means for latching the electric potential at the intermediate connection node to make the intermediate connection node act as a storage node of a programmed value of the programmable element, wherein during a second period subsequent to a first period after power is turned on, at least the second switching element is turned on, the storage node is connected to the second power terminal via the programmable element, and a state of the storage node is detected by the detecting portion, and during a third period after the second period, both the first and the second switching elements are turned off, and the state of the storage node is held by the latch means; and a second programmed value determining circuit having a same configuration as that of the first programmed value determining circuit and corresponding to the second circuit block.

19. The semiconductor integrated circuit device according to claim 18, wherein timings of the first and the second control signals are different among a plurality of programmed value determining circuits including the first and the second programmed value determining circuits.

20. A semiconductor integrated circuit device of a multi-chip type in which a chip module including a plurality of chips arranged in a plane is mounted on a substrate, wherein the plurality of chips have a plurality of corresponding circuit blocks, and a circuit block located nearest to a power circuit configured on the substrate of the plurality of circuit blocks includes:

a first programmed value determining circuit corresponding to the circuit block located nearest to the power circuit, including:

a programmable element whose resistance is changed depending on whether or not there is a program, a detecting portion including a first circuit and a second circuit, the first circuit including first and second switching elements that operate in response to first and second control signals respectively, the first and second switching elements and the programmable element being connected in series between a first power terminal and a second power terminal such that at least the first switching element is inserted between the first power terminal and an intermediate connection node, and at least the second switching element connected to the programmable element in series is inserted between the intermediate connection node and the second power terminal, and the second circuit converting an electric potential at the intermediate connection node to a logic level and outputting it to an output node; and latch means for latching the electric potential at the intermediate connection node to make the intermediate connection node act as a storage node of a programmed value of the programmable element, wherein during a second period subsequent to a first period after power is turned on, at least the second switching element is turned on, the storage node is connected to the second power terminal via the programmable element, and a state of the storage node is detected by the detecting portion, and during a third period after the second period, both the first and the second switching elements are turned off, and the state of the storage node is held by the latch means; and a second programmed value determining circuit having a same configuration as that of the first programmed value determining circuit and corresponding to another circuit block.

21. The semiconductor integrated circuit device according to claim 20, wherein timings of the first and the second control signals are different among a plurality of programmed value determining circuits including the first and second programmed value determining circuits.

22. A method for determining a programmed value using:

a programmable element whose resistance is changed depending on whether or not there is a program, a first circuit including first and second switching elements that operate in response to first and second control signals respectively, the first and second switching elements and the programmable element being connected in series between a first power terminal and a second power terminal such that at least the first switching element is inserted between the first power terminal and an intermediate connection node, and at least the second switching element connected to the programmable element in series is inserted between the intermediate connection node and the second power terminal; and a second circuit for converting an electric potential at the intermediate connection node to a logic level and outputting it to an output node; and latch means for latching the electric potential at the intermediate connection node to make the intermediate connection node act as a storage node of a programmed value of the programmable element, the method comprising the steps of:

turning at least the second switching element on, connecting the storage node to the second power terminal via the programmable element, and detecting a state of the storage node by the first and the second circuits during a second period subsequent to a first period after power is turned on, and turning both the first and the second switching elements off, and holding the state of the storage node by the latch means during a third period after the second period.

* * * * *